US008227567B2

(12) United States Patent
Sotzing

(10) Patent No.: US 8,227,567 B2
(45) Date of Patent: Jul. 24, 2012

(54) CONDUCTIVE POLYMERS FROM PRECURSOR POLYMERS, METHOD OF MAKING, AND USE THEREOF

(75) Inventor: Gregory A. Sotzing, Storrs, CT (US)

(73) Assignee: University of Connecticut, Farmington, CT (US)

( * ) Notice: Subject to any disclaimer, the term of this patent is extended or adjusted under 35 U.S.C. 154(b) by 989 days.

(21) Appl. No.: 11/675,842

(22) Filed: Feb. 16, 2007

(65) Prior Publication Data

US 2007/0191576 A1 Aug. 16, 2007

Related U.S. Application Data

(60) Provisional application No. 60/773,906, filed on Feb. 16, 2006.

(51) Int. Cl.
*C08G 75/24* (2006.01)
*C08G 75/06* (2006.01)
*C08G 65/04* (2006.01)

(52) U.S. Cl. ........ 528/384; 528/373; 528/377; 528/409; 525/328.5; 525/330.7; 525/535; 525/540

(58) Field of Classification Search ................... 528/411, 528/384, 373, 377, 409; 525/328.5, 330.7, 525/535, 540
See application file for complete search history.

(56) References Cited

U.S. PATENT DOCUMENTS

| 4,639,328 | A | 1/1987 | Krause et al. |
| 4,663,001 | A | 5/1987 | Lazzaroni et al. |
| 4,910,645 | A | 3/1990 | Jonas et al. |
| 4,959,430 | A | 9/1990 | Jonas et al. |
| 4,986,886 | A | 1/1991 | Wei et al. |
| 5,109,070 | A | 4/1992 | Epstein et al. |
| 5,162,473 | A | 11/1992 | Jen et al. |
| 5,300,575 | A | 4/1994 | Jonas et al. |
| 5,561,030 | A | 10/1996 | Holdcroft et al. |
| 5,691,062 | A | 11/1997 | Shalaby et al. |
| 6,194,540 | B1 | 2/2001 | Ito et al. |
| 6,242,561 | B1 | 6/2001 | Mohwald et al. |
| 6,294,245 | B1 | 9/2001 | Roitman et al. |
| 6,645,401 | B2 | 11/2003 | Giles et al. |
| 7,060,846 | B2 | 6/2006 | Zahn et al. |
| 7,071,289 | B2 | 7/2006 | Sotzing |
| 7,094,365 | B2 | 8/2006 | Zahn et al. |
| 7,118,692 | B2 | 10/2006 | Nordquist et al. |
| 7,241,904 | B2 | 7/2007 | Zahn et al. |
| 7,270,871 | B2 | 9/2007 | Jiang et al. |
| 2002/0011420 | A1 | 1/2002 | Roitman et al. |

(Continued)

FOREIGN PATENT DOCUMENTS

CA 2343444 A1 3/2000

(Continued)

OTHER PUBLICATIONS

Chahma et al; Synthesis—silanes; 2004; Canada journal of Chemistry(2004), 82(11), 1629-1633; Chem Abstract 142:392759.*

(Continued)

*Primary Examiner* — Duc Truong
(74) *Attorney, Agent, or Firm* — Cantor Colburn LLP

(57) ABSTRACT

Disclosed herein are precursor polymers containing units of heteroaryls and units of Si, Sn, Ge, or Pb, methods of producing the precursor polymers, and applications utilizing these precursor polymers to prepare conductive polymers.

10 Claims, 5 Drawing Sheets

U.S. PATENT DOCUMENTS

| | | |
|---|---|---|
| 2004/0074779 A1 | 4/2004 | Sotzing |
| 2005/0124784 A1 | 6/2005 | Sotzing |
| 2005/0209419 A1 | 9/2005 | Zahn et al. |
| 2006/0147616 A1 | 7/2006 | Gaudiana et al. |
| 2006/0223977 A1 | 10/2006 | Zahn et al. |

FOREIGN PATENT DOCUMENTS

| | | |
|---|---|---|
| EP | 0576300 A1 | 12/1993 |
| EP | 0 999 242 A1 | 1/1999 |
| EP | 0999242 A1 | 5/2000 |
| EP | 1321483 A | 6/2003 |
| EP | 1510535 A1 | 3/2005 |
| FR | 2655655 A | 6/1991 |
| WO | 91/06887 A1 | 5/1991 |
| WO | 9106887 A1 | 5/1991 |
| WO | 01/51690 A1 | 7/2001 |
| WO | 03054053 A1 | 7/2003 |

OTHER PUBLICATIONS

Sotzing et al; Poly(3,4-ethylenedioxythiophene)—derivatives; Wiley VCH;1997, 9(10),795-798; Chem Abstract 127:248507.*

Yuan, et al., "Organosilicon Polymers with Alternating sigma and pi Conjugated Systems", Applied Organometallic Chemistry, vol. 8, 423-430 (1994).

Yi, et al., "Synthesis and electrochemical property of organosilicon polymers containing pi electron conjugating system", Synthetic Metals, 61 (1993) 247-251.

Masuda, et al., "Electrochemical polymerization of thiophene bearing various silyl substituents", Synthetic Metals, 55-57 (1993), 1246-1250.

Wildeman, et al., Synthesis of Poly[(silanylene) thiophene]s, Journal of Inorganic and Organometallic Polymers, vol. 1, No. 4, 1991, 567-580.

Waugaman, et al., "Synthesis and Characterization of poly[(3-oligo/polydimethylsiloxane) thiophene -co-3-methylthiophene] Copolymers", Polymer Preprints (American Chemical Society, Division of Polymer Chemistry) (1997), 38(2), 257-258.

Sotzing, et al., "Poly(3,4-ethylenedioxythiophene) (PEDOT) Prepared via Electrochemical Polymerization of EDOT, 2/2'-Bis(3,4-ethylenedioxythiophene) (BiEDOT), and Their TMS Derivatives", Adv. Mater., 1997, 9, No. 10, 795-798.

Brzezinski, Jacek Z and Reynolds, John R; A New and Improved and Convenient Synthesis of 4H-Cyclopenta[2,1-b:3,4-b']-dithiophen-4-one, Synthesis 2002, No. 8, 1053-1056, Received Mar. 13, 2002.

Iraqi et al., "Synthesis of methacrylate and silicone polymers with pendant thiophene groups", Synthetic Metals 84 (1997), 377-378.

Silcoff, et al., "Sythesis of Polymers with Isolated Thiophene-Based Chromophores", Macromolecules 1998, 31, 9116-9120.

Bouachrine, et al., "Oxidative Polymerisation of Silyl Monomers. Applications and Limits", Synthetic Metals 101 (1999) 15-16.

Fang, et al., Synthesis of silylene-phenylene and silylene-thienylene copolymers and their optical properties; Journal of Organometallic Chemistry 489 (1995) 15-22.

Lee, et al., Synthesis of poly(thieno[3,4-b]thiophene) and its electrochemical characterization; Poymer Preprints 2001, 42(2), 413-414.

Lee, et al., Thieno[3,4-b]thiophene as a Novel Low Oxidation Crosslinking Agent, Polymeric Materials: Science and Engineering 2002, 86, 195.

Lee, et al., Toward the Use of Poly(Thieno[3-4-b]Thiophene) in Optoelectronic Devices, Polymer Preprints 2002, 43(2), 610-611.

Lee, et al., Aqueous Phase Polymerization of Thieno[3,4-b]Thiophene, Polymer Preprints 2002, 4392), 568-569.

Lee, et al., Poly(thieno[3,4-b]thiophene). A New Stable Low Band Gap Conduction Polymer, Macromolecules 2001, 34, 5746-5747.

Lee, et al., Synthesis and Characterization of a Soluble and Transparent Conducting Polymer, Poly(3,4-Ethylenedioxythiophene), Jul. 30, 1998, pp. 237-240.

Wynberg et al., Thieno[3,4-b] Thiophene. The Third Thiophthene, Tetrahedron Letters No. 9, pp. 761-764, 1967.

Xiaomin Gu, Part I: Synthesis and Chrararcterization of Poly92-Decylthieno[3,4-b]Thiophene), a Low Bandgap Conducting Polymer PartII: Formation and Trapping of Methoxy(Methoxy-Carbonyl)Ketene, University of Texas at Arlington, Dec. 1995, 184 pages.

Bongini, et al., New n-Dopable Thiophene Based Polymers, Synthetic Metals 101 (1999) 13-14.

Eldo, et al., New Low Band Gap Polymers: Control of Optical and Electronic Properties in near Infrared Absorbing Conjugated Polysquaraines, Chem. Mater 2002, 14, 410-418.

Meng, et al., A Robust Low Band Gap Processable n-Type Conducting Polymer Based on Poly(isothianaphthene), Macromolecules 2001, 34, 1810-1816.

Kumar, et al., Communications to the Editor, Macromolecules, vol. 39, No. 8, Apr. 18, 2006, 2 pages.

Watson, et al., Polymerizable Monomers, XP-000950240, 2000 American Chemical Society, Published on Web Jun. 1, 2000, 6 pages.

Deeter, et al., Asymmetric Synthesis and Absolute Stereochemistry of LY248686, Tetrahedron Letters, vol. 31, No. 49, pp. 7101-7104, 1990.

Seshadri, et al., Ion Transport Behavior of Polymers and Copolymers Containing Thieno[3,4-b]Thiophene, Polymer Preprints 2002, 43(2), 584-585.

Neef, et al., Synthesis and Electronic Properties of Poly(2-Phenylthieno[3,4-b]Thiophene) Polymer Preprints 1998, 39(1), pp. 147-148.

Neef, et al., Synthesis and Electronic Properties of Poly(2-phenylthieno[3,4-b]thiophene): A New Low Band Gap Polymer, Chem. Mater. 1999, 11, 1957-1958.

Loveday, et al., Synthesis and Characterization of p- and n-Dopable Polymers. Electrochromic Properties of Poly 3-(p-trimethylammoniumphenyl)bithiophene, Synthetic Metals 84 (1997) 245-246.

Martin Pomerantz, Xiaomin Gu, Poly(2-decylthieno[3,4-b]thiophene). A New Soluble Low-Bandgap Conducting Polymer, Synthetic Metals, 84 (1997) 243-244.

Pomerantz, et al., Poly(2-decylthieno[3,4-b]thiophene-4,6-diyl). A New Low Band Gap Conducting Polymer, Macromolecules 2001, 34, 1817-1822.

Roncali, et al., Enhancement of the Mean Conjugation Length in Conducting Polythiophenes, Synthetic Metals, 18 (1987) 139-144.

Jang, et al., Poly(Terthiophene) Networks via Electrochemical Crosslinking of Terthiophene Derivatized Norbornylene Monomers and Polymers, Preprint of Orlando National ACS Conference, Apr. 2002.

Sotzing, et al., Intrinsically Conducting Polymers and Green Chemistry, Polymer Preprints 2002, 43(2), 904-905.

Sotzing, et al., Preparation and Characterization of Fully Conjugated Intrinsically Conducting Polymer Networks, Polymeric Materials: Science & Engineering 2002, 86, 40-41.

Gu, Synthesis and Characterization of Poly(2-decylthieno(3,4-b)thiophene), Chem Abstract, 125, 87896 (1996).

Moursounidis et al., The Synthesis of Thieno[3,4-b] Furan Using a Tandem Intramolecular-Reverse Diels-Alder Reaction Approach, Tetrahedron Letters, vol. 27, No. 26. pp. 3045-3048, 1986.

Neef et al., Synthesis and Electronic Properties of Poly(2-phenylthieno[3,4-b]thiophen) American Chemical Society, 128, 230943 (1998).

Neef, et al., Synthesis and Electronic Properties of Poly(2-phenylthieno[3,4-b]thiophene), American Chemical Society, 131, 214964 (1999).

Pomerantz et al., A New Soluble Low-Bandgap Conducting Polymer, Elservier, 126, 293709 (1997).

Reeves et al., Dual Cathodically and Anodically Coloring Electrochromic Polymer Based On A Spiro Bipropylenedioxythiophene [(Poly(spiroBiProDOT)], Advanced Materials, May 17, 2002, vol. 14, No. 10, 717-719.

Song Y. Hong et al., Understanding the Conformational Stability oand Electronic Structure of Modified Polymers Based on Polythiopene, Macromolecules 1992, pp. 4652-4657.

Sotzing et al., Poly(thieno[3,4-b]thiophene) as a Low Band Gap Conducting Polymer and Electrochromatic Material, Polymeric Materials: Science and Engineering 2001, 85 pgs 604-605.

Mudigonda et al., "Tailoring Electrochromic Properties through Discrete Eelctrochromes: Synthesis and Characterization of Poly[bis(5,2'-bithiophene-2-yl)dimethylsilane]", Chem. Mater. 2000, 12, 1508-1509.

FR2655655, Publication date: Jun. 14, 1991, Machine Translation; 15 pages.

nternational Searching Authority, International Search Report, PCT/US2007/004515, Date of mailing: Sep. 16, 2008, 6 pages.

International Searching Authority, Writtten Opinion, PCT/US2007/004515, International filing date: Feb. 16, 2007, 6 pages.

* cited by examiner

CONDUCTIVE POLYMERS FROM PRECURSOR POLYMERS, METHOD OF MAKING, AND USE THEREOF

CROSS-REFERENCE TO RELATED APPLICATIONS

This application claims the benefit of U.S. Provisional Application Ser. No. 60/773,906, filed Feb. 16, 2006, which is incorporated herein by reference in its entirety.

TECHNICAL FIELD

This invention relates to precursor polymers containing Si, Ge, Sn, or Pb, methods of producing such precursor polymers, and applications utilizing the precursor polymers to prepare conductive polymers.

BACKGROUND

Intrinsically conducting polymers are of wide utility in applications such as electronic packaging, organic light-emitting diodes (LEDs), electrochromic windows and displays, volatile organic gas sensors, and the like. Intrinsically conducting polymers of particular interest possess a relatively low band gap (Eg), which refers to the energy difference between two electronic energy levels (the conduction band and the valence band). The band gap exhibited by a given polymer depends upon a variety of factors, including the structure of the monomer(s) used to form the polymer. For example, intrinsically conductive polymers formed from thiophene and substituted thiophene monomers are known. Poly(thiophene) has a band gap of 2.1 electron volts (eV), poly(3,4-ethylenedioxythiophene) (a.k.a. PEDOT) has a band gap of 1.7 eV, poly(2-decylthieno[3,4-b]thiophene) has a band gap of 0.92 eV, and poly(2-phenylthieno[3,4-b]thiophene) has a band gap of 0.85 eV. Intrinsically conductive polymers comprising polymerized units of thieno[2,3-b]thiophene, thieno[3,2-b]thiophene and other fused and substituted thiophenes are also known.

There are a number of drawbacks associated with many of the currently available processes of making these intrinsically conducting polymers. For example, one current process of making conductive PEDOT polymers, which are widely used for making capacitors, is via a dipping process of the tantalum/tantalum oxide substrates into a bath containing the monomer 3,4-ethylenedioxythiophene (a.k.a. EDOT) and ferric chloride. The bath life is only 48 hrs since EDOT is unstable in the presence of ferric chloride, the yields are low, less than 30%, and generally, PEDOT will deposit on all surfaces including the capacitors, the bath walls, etc.

There remains a continuing need in the art for more stable starting materials that can be converted directly into a conductive polymer. Furthermore, there is a need for an improved process of making conductive polymers that is more convenient and efficient, and that would provide higher molecular weight products with better mechanical properties.

BRIEF SUMMARY OF THE INVENTION

In one embodiment, a precursor polymer comprises a polymer according to the structure:

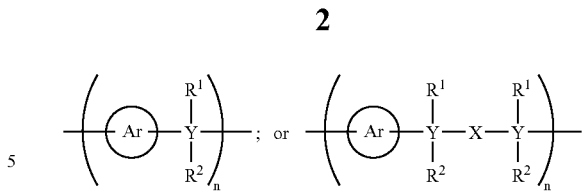

wherein Ar is a heteroaryl group; each occurrence of $R^1$ and $R^2$ is independently $C_1$-$C_{12}$ alkyl, $C_1$-$C_{12}$ haloalkyl, or aryl; X is O, S, $(YR^1R^2)_x$, or $(CR^aR^b)_x$ wherein x is 0, 1, 2, 3, or 4, and $R^a$ and $R^b$ are independently hydrogen, $C_1$-$C_{12}$ alkyl, or $C_1$-$C_{12}$ haloalkyl; each occurrence of Y is independently Si, Ge, Sn, or Pb; and n is about 10 or greater; and including copolymers thereof or blends comprising at least one of the foregoing polymers.

In another embodiment, a polymer comprises a polymer according to the structure:

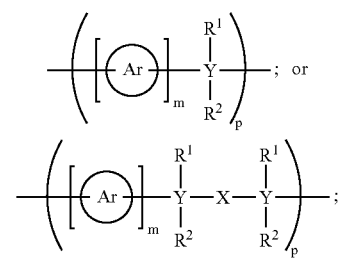

wherein Ar is a heteroaryl group; each occurrence of $R^1$ and $R^2$ is independently $C_1$-$C_{12}$ alkyl, $C_1$-$C_{12}$ haloalkyl, or aryl; X is O, S, $(YR^1R^2)_x$, or $(CR^aR^b)_x$ wherein x is 0, 1, 2, 3, or 4, and $R^a$ and $R^b$ are independently hydrogen, $C_1$-$C_{12}$ alkyl, or $C_1$-$C_{12}$ haloalkyl; each occurrence of Y is independently Si, Ge, Sn, or Pb; m is about 3 or greater; and p is about 5 or greater; and including copolymers thereof or blends comprising at least one of the foregoing polymers.

In another embodiment, a method of preparing a conductive conjugated polymer comprises converting a precursor polymer having the following structure:

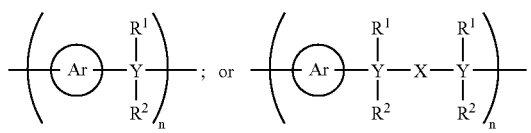

copolymers thereof or blends comprising at least one of the foregoing polymers wherein each occurrence of Ar is a heteroaryl group; each occurrence of $R^1$ and $R^2$ is independently $C_1$-$C_{12}$ alkyl, $C_1$-$C_{12}$ haloalkyl, or aryl; X is O, S, $(YR^1R^2)_x$, or $(CR^aR^b)_x$ wherein x is 0, 1, 2, 3, or 4, and $R^a$ and $R^b$ are independently hydrogen, $C_1$-$C_{12}$ alkyl, or $C_1$-$C_{12}$ haloalkyl; each occurrence of Y is independently Si, Ge, Sn, or Pb; and n is about 10 or greater; to form a conductive conjugated polymer having the structure:

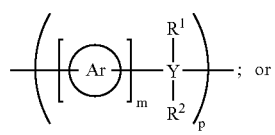

-continued

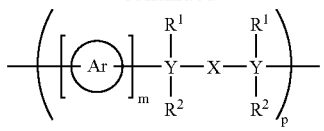

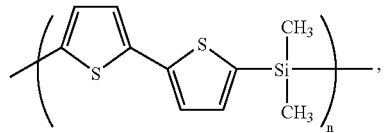

wherein Ar is a heteroaryl group; each occurrence of $R^1$ and $R^2$ is independently $C_1$-$C_{12}$ alkyl, $C_1$-$C_{12}$ haloalkyl, or aryl; X is O, S, $(YR^1R^2)_x$, or $(CR^aR^b)_x$ wherein x is 0, 1, 2, 3, or 4, and $R^a$ and $R^b$ are independently hydrogen, $C_1$-$C_{12}$ alkyl, or $C_1$-$C_{12}$ haloalkyl; each occurrence of Y is independently Si, Ge, Sn, or Pb; m is about 3 or greater; and p is about 5 or greater.

Other embodiments include, methods of processing the precursor polymers and articles prepared therefrom.

DETAILED DESCRIPTION OF THE INVENTION

Figure 1:
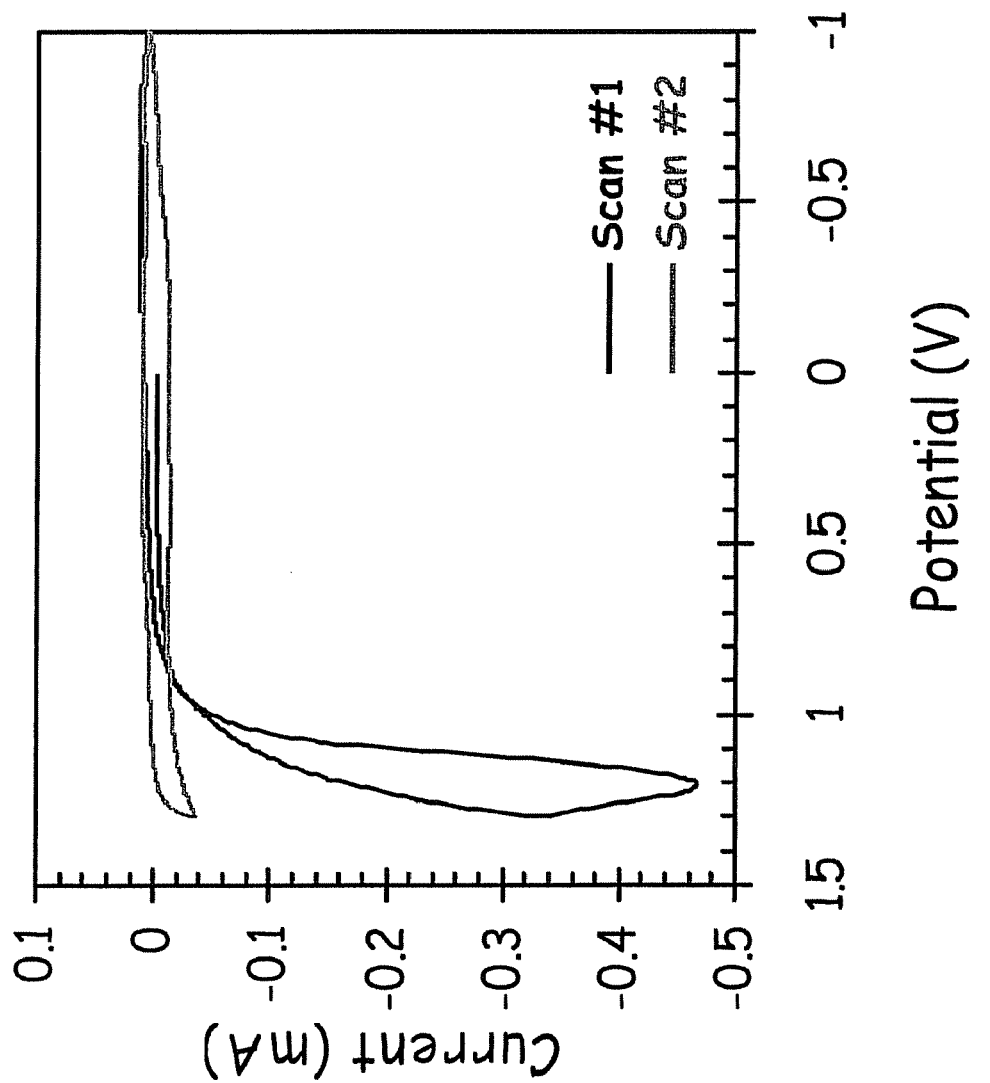
FIG. 1 illustrates the solid-state conversion of a precursor polymer containing 3,4-ethylenedioxythiophene (EDOT) units and dimethylsilyl units to a conductive conjugated polymer.

Disclosed herein are precursor polymers containing units of heteroaryls linked by one or more Silicon (Si) containing groups, Germanium (Ge) containing groups, Tin (Sn) containing groups, or Lead (Pb) containing groups, methods of preparing these precursor polymers, and methods of preparing conductive conjugated polymers using these precursor polymers. The precursor polymers provide a convenient and facile method to prepare conductive polymers as the precursor polymers are often more stable than their heteroaryl monomeric counterparts. For example, EDOT and thieno[3,4-b]thiophene (a.k.a. T34bT) require refrigeration while the precursor polymers containing units of EDOT and thieno[3,4-b]thiophene separated by units containing Si, Ge, Sn, and/or Pb are stable at ambient temperatures.

Additionally, the precursor polymers can be prepared from inexpensive starting materials, e.g. the corresponding difunctionalized silyl dihalide monomers. Many of the precursor polymers have been found to be near polydisperse exhibiting weight average molecular weight to number average molecular weight (Mw/Mn) values of approximately 2. Furthermore, the precursor polymers have many desirable mechanical properties, such as high thermal stability. For example, the precursor polymers having the general structure wherein n is about 10 or greater, have very high thermal stability as the decomposition temperature can be as high as 440° C.

Also disclosed herein are conductive conjugated polymers that are obtained via conversion of the precursor polymers via chemical oxidation, electrochemical oxidation, or bromine conversion. For example, conductive conjugated polymers can be obtained via electrochemical oxidation of precursor polymers in the solid-swollen state. In another embodiment, conjugated polymers can be obtained via exposure of the precursor polymers to bromine with heat treatment. Furthermore, the solid-state conversion of the precursor polymer to a conductive conjugated polymer results in a greater yield of conductive polymer as compared to other known processes to prepare conductive polymer. These conductive conjugated polymers have utilities in a wide variety of applications, for example, electronic packaging, organic light-emitting diodes (LEDs), electrochromic windows and displays, optically transparent electrodes, volatile organic gas sensors, as well as other applications discussed herein.

The precursor polymers are easily processed into films using standard techniques such as cast, spin, dip, inkjet, spray, screen print, melt processing, and other well-known processes. It has been found that the precursor polymers have good adhesion to oxo substrates (e.g. oxide substrates including tantalum oxide, indium tin oxide, etc.).

Disclosed herein are precursor polymers having the following general structures (1) and (2):

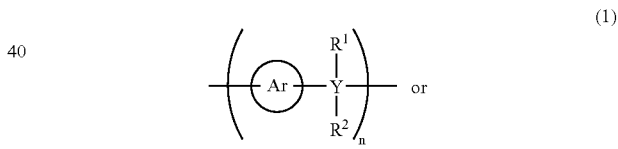

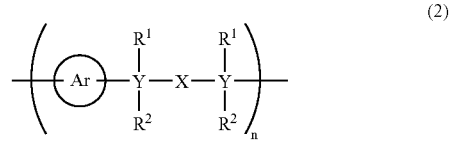

wherein Ar is a heteroaryl group; $R^1$ and $R^2$ are independently $C_1$-$C_{12}$ alkyl, $C_1$-$C_{12}$ haloalkyl, or aryl; X is O, S, $(YR^1R^2)_x$ where x is 0, 1, 2, 3, or 4, $(CR^aR^b)_x$ where $R^a$ and $R^b$ are independently hydrogen, $C_1$-$C_{12}$ alkyl, or $C_1$-$C_{12}$ haloalkyl and wherein x is 0, 1, 2, 3, or 4. Each Y is independently Si, Ge, Sn, or Pb. The number of repeat units (n) of the precursor polymer can be greater than about 10, specifically greater than about 15. Specifically n can be about 10 to about 350, more specifically about 15 to about 300, and yet more specifically about 20 to about 250.

In one embodiment, $R^1$ and $R^2$ are independently $C_1$-$C_{12}$ alkyl; more specifically methyl, ethyl, propyl, butyl, hexyl, or octyl, and yet more specifically methyl or octyl; X is O; and Y is Si or Ge.

In another embodiment, precursor polymers according to the structures (1) and (2) can comprise Si and Ge in a ratio of about 1:99 to about 99:1 of Si:Ge, specifically a ratio of about 10:90 to about 90:10 of Si:Ge, more specifically a ratio of about 25:75 to about 75:25 of Si:Ge, and yet more specifically a ratio of about 40:60 to about 60:40 of Si:Ge.

A desired polymer size and weight can be obtained by varying the starting materials or preparation conditions. Furthermore, the polymer precursors can have specific endgroups via use of an appropriate endcapping reagent. For example, a trimethylsilylchloride would provide a precursor polymer that would have trimethylsilyl endgroups. Additionally, by adjusting the molecular weight of the precursor polymer, the processing conditions can be changed. For example, for spray coating, low molecular weight, low viscosity precursor polymers having a low n value can be prepared.

The precursor polymer can be conveniently prepared from the corresponding heteroaryl monomers or derivatives thereof. In one embodiment, the heteroaryl monomer is deprotonated and reacted with an appropriate species $R^1R^2YZ_2$ in the presence of a base, which is then converted to the precursor polymer.

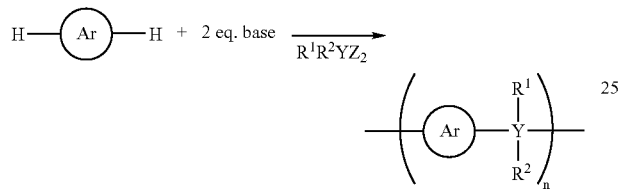

$R^1$ and $R^2$ are independently $C_1$-$C_{12}$ alkyl, $C_1$-$C_{12}$ haloalkyl, or aryl; Y is Si, Ge, Sn, or Pb; and each Z is independently Cl, Br, or I. Suitable bases include, for example, alkyl lithium (e.g. t-butyl Li, n-butyl Li, sec-butyl Li), lithium dialkyl amides (e.g. lithium diisopropylamide), or other base of equivalent basicity. Conditions for the preparation of the precursor polymer are provided in more detail below.

The prepared precursor polymer having the presence of the Si, Ge, Sn, or Pb units allows for high molecular weight polymers which can be processed as conventional polymers. Additionally, the precursor polymers are soluble in a variety of solvents allowing for solution processing. Adjusting the lengths of the alkyl groups pendent from the Si, Ge, Sn, or Pb allows for the tailoring of solubility in organic solvents. Additionally, many of the precursor polymers have a melt transition allowing for melt processing such as by compression molding, injection molding, melt spinning, and the like.

The units of Si, Ge, Sn, or Pb in the precursor polymer allows for rotation in the precursor polymer backbone while the heteroaryl is a rigid portion in the backbone. Such a combination of groups is similar to a flexible/rigid main chain liquid crystal. The heteroaryl groups in the precursor polymer can crystallize to give a semicrystalline material. Such crystallinity translates to higher conductivities as compared to amorphous conjugated polymers. Therefore, the crystallinity can possibly be maintained when the precursor polymer is converted to the conductive polymer which is more pi conjugated, thereby enhancing the conductivity of the formed conductive polymer.

The heteroaryl (Ar group) in the general structures (1) and (2) above is not particularly limited, and can be chosen to result in a conductive polymer having desired physical and electrochemical properties. Exemplary heteroaryl monomers used to prepare the precursor polymers include those disclosed below, as well as derivatives thereof. Exemplary derivatives include replacement of an aryl hydrogen with a halogen for example which can be converted to the corresponding organometallic (e.g. addition of magnesium to form a di-Grignard reagent for ambient temperature processes).

Suitable heteroaryl monomers include unsubstituted and 2- or 6-substituted thieno[3,4-b]thiophene and thieno[3,4-b]furan having the general structure (I), (II), and (III):

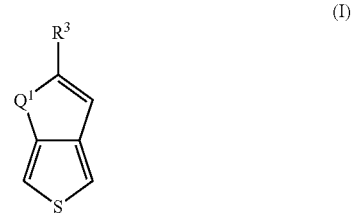

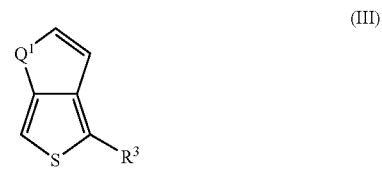

wherein $Q^1$ is S or O; and $R^3$ is hydrogen, $C_1$-$C_{12}$ alkyl, $C_1$-$C_{12}$ haloalkyl including perfluoroalkyl (see the definition of "haloalkyl" below), $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. Specifically, $Q^1$ is S or O; and $R^3$ is hydrogen.

3,4-Ethylenedioxythiophene, 3,4-ethylenedithiathiophene, 3,4-ethylenedioxypyrrole, 3,4-ethylenedithiapyrrole, 3,4-ethylenedioxyfuran, 3,4-ethylenedithiafuran, and derivatives having the general structure (IV):

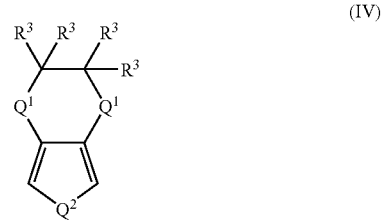

wherein each occurrence of $Q^1$ is independently S or O; $Q^2$ is S, O, or N—$R^4$ wherein $R^4$ is hydrogen or $C_1$-$C_6$ alkyl; and each occurrence of $R^3$ is hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, the monomer has the general structure (IV) with the proviso that when $Q^2$ is S and $Q^1$ are O, $R^3$ is not hydrogen.

Isathianaphthene, pyridothiophene, pyrizinothiophene, and derivatives having the general structure (V):

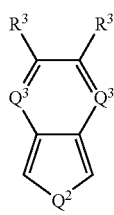

wherein $Q^2$ is S, O, or $N-R^4$ wherein $R^4$ is hydrogen or $C_1$-$C_6$ alkyl; each occurrence of $Q^3$ is independently CH or N; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Oxazole, thiazole, and derivatives having the general structure (VI):

wherein $Q^1$ is S or O.

Pyrrole, furan, thiophene, and derivatives having the general structure (VII):

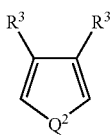

wherein $Q^2$ is S, O, or $N-R^4$ wherein $R^4$ is hydrogen or $C_1$-$C_6$ alkyl; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, the monomer has the general structure (VII) with the proviso that when $Q^2$ is S at least one $R^3$ is not hydrogen.

Bithiophene, bifuran, bipyrrole, and derivatives having the following general structure (VIII):

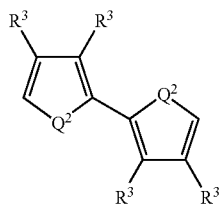

wherein each occurrence of $Q^2$ is independently S, O, or $N-R^4$ wherein $R^4$ is hydrogen or $C_1$-$C_6$ alkyl; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Terthiophene, terfuran, terpyrrole, and derivatives having the following general structure (IX):

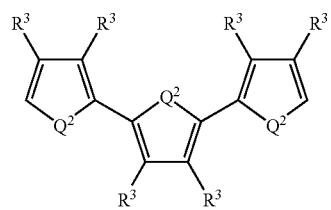

wherein each occurrence of $Q^2$ is independently S, O, or $N-R^4$ wherein $R^4$ is hydrogen or $C_1$-$C_6$ alkyl; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Thienothiophene, thienofuran, thienopyrrole, furanylpyrrole, furanylfuran, pyrolylpyrrole, and derivatives having the following general structure (X):

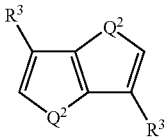

wherein each occurrence of $Q^2$ is independently S, O, or $N-R^4$ wherein $R^4$ is hydrogen or $C_1$-$C_6$ alkyl; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Dithienothiophene, difuranylthiophene, dipyrrolylthiophene, dithienofuran, dipyrrolylfuran, dipyrrolylpyrrole, and derivatives having the following general structure (XI):

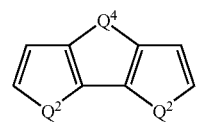

wherein each occurrence of $Q^2$ is independently S, O, or $N-R^4$ wherein $R^4$ is hydrogen or $C_1$-$C_6$ alkyl; $Q^4$ is $C(R^3)_2$, S, O, or $N-R^4$; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Dithienylcyclopentenone, difuranylcyclopentenone, dipyrrolylcyclopentenone and derivatives having the following general structure (XII):

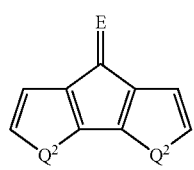

wherein each occurrence of $Q^2$ is independently S, O, or N—$R^4$ wherein $R^4$ is hydrogen or $C_1$-$C_6$ alkyl; and E is O or $C(R^7)_2$, wherein each occurrence of $R^7$ is an electron withdrawing group.

Other suitable heteroaryl monomers include those having the following general structure (XIII):

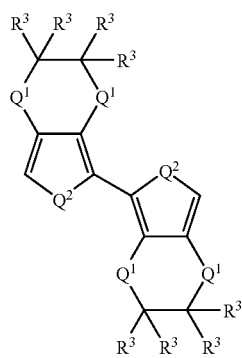

(XIII)

wherein each occurrence of $Q^1$ is independently S or O; each occurrence of $Q^2$ is independently S, O, or N—$R^4$ wherein $R^4$ is hydrogen or $C_1$-$C_6$ alkyl; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, each occurrence of $Q^1$ is O; each occurrence of $Q^2$ is S; and each occurrence of $R^3$ is hydrogen.

Dithienovinylene, difuranylvinylene, and dipyrrolylvinylene according to the structure (XIV):

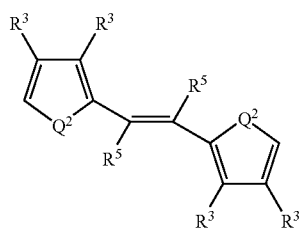

(XIV)

wherein each occurrence of $Q^2$ is independently S, O, or N—$R^4$ wherein $R^4$ is hydrogen or $C_1$-$C_6$ alkyl; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and each occurrence of $R^5$ is hydrogen, $C_1$-$C_6$ alkyl, or cyano.

1,2-Trans(3,4-ethylenedioxythienyl)vinylene, 1,2-trans(3,4-ethylenedioxyfuranyl)vinylene, 1,2-trans(3,4ethylenedioxypyrrolyl)vinylene, and derivatives according to the structure (XV):

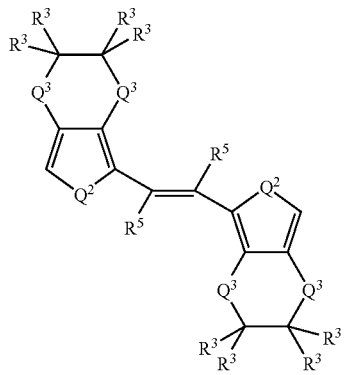

(XV)

wherein each occurrence of $Q^3$ is independently $CH_2$, S, or O; each occurrence of Q is independently S, O, or N—$R^4$ wherein $R^4$ is hydrogen or $C_1$-$C_6$ alkyl; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and each occurrence of $R^5$ is hydrogen, $C_1$-$C_6$ alkyl, or cyano.

The class bis-thienylarylenes, bis-furanylarylenes, bis-pyrrolylarylenes and derivatives according to the structure (XVI):

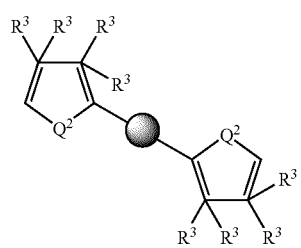

(XVI)

wherein each occurrence of $Q^2$ is independently S, O, or N—$R^4$ wherein $R^4$ is hydrogen or $C_1$-$C_6$ alkyl; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and

represents an aryl. Exemplary aryl groups include furan, pyrrole, N-substituted pyrrole, phenyl, biphenyl, thiophene, fluorene, 9-alkyl-9H-carbazole, and the like.

The class of bis(3,4-ethylenedioxythienyl)arylenes, related compounds, and derivatives according to the structure (XVII):

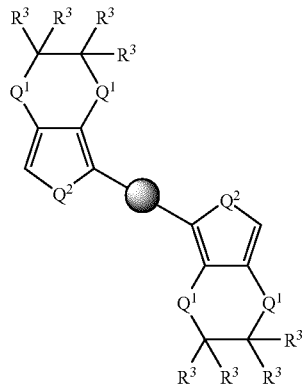

wherein each occurrence of $Q^1$ is independently S or O; each occurrence of $Q^2$ is independently S, O, or N—$R^4$ wherein $R^4$ is hydrogen or $C_1$-$C_6$ alkyl; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and

represents an aryl.

An exemplary bis(3,4-ethylenedioxythienyl)arylenes according to structure (XVII) includes the compound wherein all $Q^1$ are O, both $Q^2$ are S, all $R^3$ are hydrogen, and

is phenyl linked at the 1 and 4 positions. Another exemplary compound is where all $Q^1$ are O, both $Q^2$ are S, all $R^3$ are hydrogen, and

is thiophene linked at the 2 and 5 positions.

The class of compounds according to structure (XVIII):

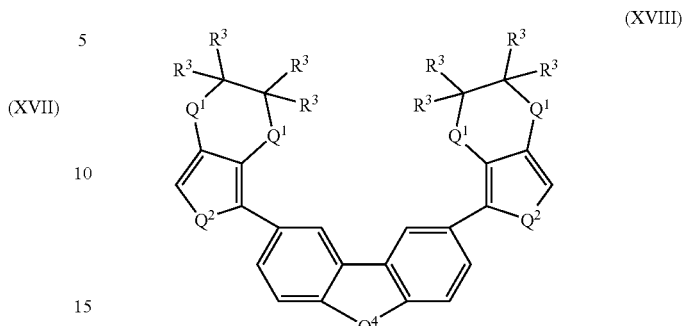

wherein each occurrence of $Q^1$ is independently S or O; each occurrence of $Q^2$ is independently S, O, or N—$R^4$ wherein $R^4$ is hydrogen or $C_1$-$C_6$ alkyl; $Q^4$ is $C(R^3)_2$, S, O, or N—$R^4$; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, each occurrence of $Q^1$ is O; each occurrence of $Q^2$ is S; each occurrence of $R^3$ is hydrogen; and $R^4$ is methyl.

The class of compounds according to structure (XIX):

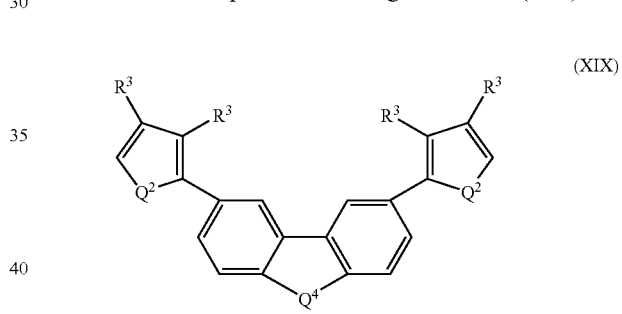

wherein each occurrence of $Q^2$ is independently S, O, or N—$R^4$ wherein $R^4$ is hydrogen or $C_1$-$C_6$ alkyl; $Q^4$ is $C(R^3)_2$, S, O, or N—$R^4$; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

The class of compounds according to structure (XX):

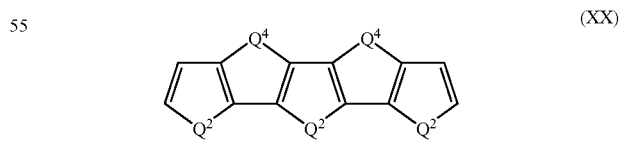

wherein each occurrence of $Q^2$ is independently S, O, or N—$R^4$ wherein $R^4$ is hydrogen or $C_1$-$C_6$ alkyl; each occurrence of $Q^4$ is $C(R^3)_2$, S, O, or N—$R^4$; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

The class of compounds according to structure (XXI):

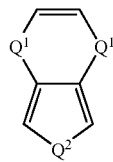

(XXI)

wherein $Q^2$ is S, O, or N—$R^4$ wherein $R^4$ is hydrogen or $C_1$-$C_6$ alkyl; and each occurrence of $Q^1$ is independently S or O.

The class of compounds according to structure (XXII):

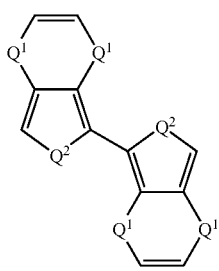

(XXII)

wherein each occurrence of $Q^2$ is independently S, O, or N—$R^4$ wherein $R^4$ is hydrogen or $C_1$-$C_6$ alkyl; and each occurrence of $Q^1$ is independently S or O.

The class of compounds according to structure (XXIII):

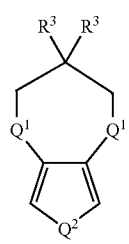

(XXIII)

wherein $Q^2$ is S, O, or N—$R^4$ wherein $R^4$ is hydrogen or $C_1$-$C_6$ alkyl; each occurrence of $Q^1$ is independently S or O; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, one $R^3$ is methyl and the other $R^3$ is —$C_1$-$C_6$ alkyl-O-phenyl or —$C_1$-$C_6$ alkyl-O-biphenyl.

The class of compounds according to structure (XXIV):

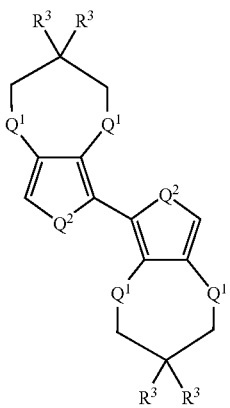

(XXIV)

wherein each occurrence of $Q^2$ is independently S, O, or N—$R^4$ wherein $R^4$ is hydrogen or $C_1$-$C_6$ alkyl; each occurrence of $Q^1$ is independently S or O; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl. In one embodiment, one $R^3$ is methyl and the other $R^3$ is —$C_1$-$C_6$ alkyl-O-phenyl or —$C_1$-$C_6$ alkyl-O-biphenyl per geminal carbon center.

The class of compounds according to structure (XXV):

(XXV)

wherein each occurrence of $Q^2$ is independently S, O, or N—$R^4$ wherein $R^4$ is hydrogen or $C_1$-$C_6$ alkyl; each occurrence of $Q^1$ is independently S or O; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and

represents an aryl. In one embodiment, one $R^3$ is methyl and the other $R^3$ is —$C_1$-$C_6$ alkyl-O-phenyl or —$C_1$-$C_6$ alkyl-O-biphenyl per geminal carbon center.

The class of compounds according to structure (XXVI):

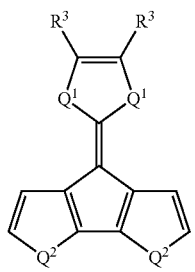

(XXVI)

wherein each occurrence of $Q^2$ is independently S, O, or N—$R^4$ wherein $R^4$ is hydrogen or $C_1$-$C_6$ alkyl; each occurrence of $Q^1$ is independently S or O; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

The class of compounds according to structure (XXVII):

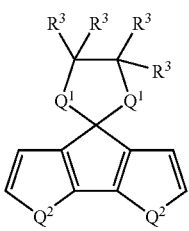

(XXVII)

wherein each occurrence of $Q^2$ is independently S, O, or N—$R^4$ wherein $R^4$ is hydrogen or $C_1$-$C_6$ alkyl; each occurrence of $Q^1$ is independently S or O; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl.

Homopolymers can be prepared when one type of heteroaryl monomer is converted to the precursor polymer. Optionally, two or more different heteroaryl monomers can be used to prepare copolymers. Other copolymers include those having units selected from two or more of Si, Ge, Sn, and Pb groups, but having one type of heteroaryl. Still further, other copolymers include those having units selected from two or more of the Si, Ge, Sn, and Pb groups and two or more types of heteroaryl monomer. The copolymers include random copolymers, block copolymers, or alternating copolymers. By selection of two or more types of heteroaryl monomer and/or two or more types of Si, Ge, Sn, or Pb groups (e.g. two or more different species of $R^1R^2YZ_2$ where the core atom Y can be different, the pendent alkyl groups $R^1$ and $R^2$ can be different, or both), a wide array of copolymers can be prepared having tailored physical and other properties.

An exemplary random copolymer having the following general structure (3) can be prepared:

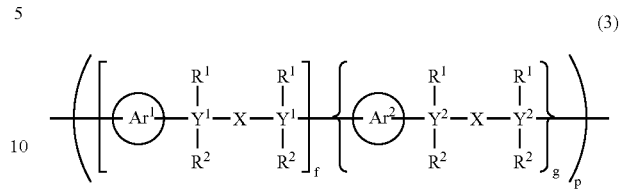

(3)

wherein $Ar^1$ and $Ar^2$ each independently is a heteroaryl group; each occurrence of $R^1$ and $R^2$ is independently $C_1$-$C_{12}$ alkyl, $C_1$-$C_{12}$ haloalkyl, or aryl; each occurrence of $Y^1$ and $Y^2$ is independently Si, Ge, Sn, or Pb; the ratio of f:g is about 5:95 to about 95:5; and p is about 5 or greater. As these are random copolymers, f and g represent the total number of units, not necessarily connected to each other, within the polymer.

In one embodiment, Ar is

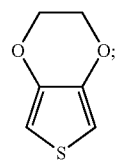

both $R^1$ and $R^2$ are methyl groups; $Y^1$ is Si and $Y^2$ is Ge.

Exemplary precursor polymers prepared from the heteroaryl monomers (I), (II), and (III) disclosed above include those having the following general structures:

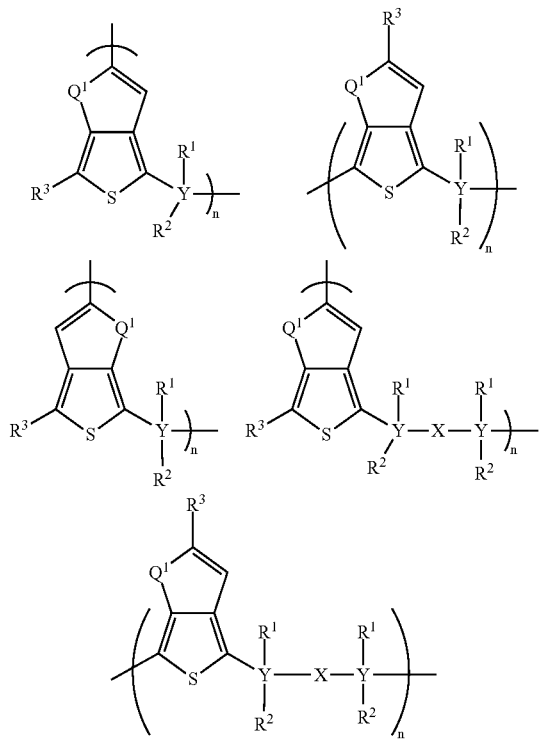

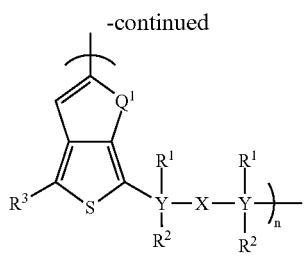

wherein $Q^1$, $R^1$, $R^2$, $R^3$, X, n, and Y are as defined above.

Exemplary precursor polymers prepared from the heteroaryl monomers (IV) disclosed above include those having the following general structures:

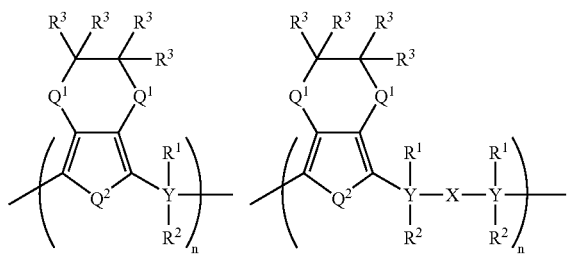

wherein $Q^1$, $Q^2$, $R^1$, $R^2$, $R^3$, X, n, and Y are as defined above. Based on the foregoing, one of ordinary skill in the art can envision the general structures of precursor polymers prepared from the heteroaryl monomers (V)-(XXVII).

As used herein, "alkyl" includes straight chain, branched, and cyclic saturated aliphatic hydrocarbon groups, having the specified number of carbon atoms, generally from 1 to about 12 carbon atoms for the straight chain and generally from 3 to about 12 carbon atoms for the branched and cyclic. Examples of alkyl include, but are not limited to, methyl, ethyl, n-propyl, isopropyl, n-butyl, 3-methylbutyl, t-butyl, n-pentyl, sec-pentyl, cyclopentyl, cyclohexyl, and octyl. Specific alkyl groups include lower alkyl groups, those alkyl groups having from 1 to about 8 carbon atoms, from 1 to about 6 carbon atoms, or from 1 to about 4 carbons atoms.

As used herein "haloalkyl" indicates straight chain, branched, and cyclic alkyl groups having the specified number of carbon atoms, substituted with 1 or more halogen atoms, generally up to the maximum allowable number of halogen atoms ("perhalogenated", e.g. perfluorinated). Examples of haloalkyl include, but are not limited to, trifluoromethyl, difluoromethyl, 2-fluoroethyl, and penta-fluoroethyl.

As used herein, "alkoxy" includes an alkyl group as defined above with the indicated number of carbon atoms attached through an oxygen bridge (—O—). Examples of alkoxy include, but are not limited to, methoxy, ethoxy, n-propoxy, i-propoxy, n-butoxy, 2-butoxy, t-butoxy, n-pentoxy, 2-pentoxy, 3-pentoxy, isopentoxy, neopentoxy, n-hexoxy, 2-hexoxy, 3-hexoxy, and 3-methylpentoxy.

"Haloalkoxy" indicates a haloalkyl group as defined above attached through an oxygen bridge.

As used herein, the term "aryl" indicates aromatic groups containing only carbon in the aromatic ring or rings. Such aromatic groups may be further substituted with carbon or non-carbon atoms or groups. Typical aryl groups contain 1 or 2 separate, fused, or pendant rings and from 6 to about 12 ring atoms, without heteroatoms as ring members. Where indicated aryl groups may be substituted. Such substitution may include fusion to a 5 to 7-membered saturated cyclic group that optionally contains 1 or 2 heteroatoms independently chosen from N, O, and S, to form, for example, a 3,4-methylenedioxy-phenyl group. Aryl groups include, for example, phenyl, naphthyl, including 1-naphthyl and 2-naphthyl, fluorene, and bi-phenyl.

"Halo" or "halogen" as used herein refers to fluoro, chloro, bromo, or iodo.

Compounds are described using standard nomenclature. For example, any position not substituted by any indicated group is understood to have its valency filled by a bond as indicated, or a hydrogen atom. A dash ("-") that is not between two letters or symbols is used to indicate a point of attachment for a substitutent. For example, —CHO is attached through carbon of the carbonyl group.

Also contemplated herein are blends comprising two or more precursor polymers. Additionally, blends comprising at least one of the foregoing precursor polymers and an additional polymer are also contemplated. The additional polymer may be a conductive polymer, a nonconductive polymer, a thermoplastic or combinations comprising at least one of the foregoing.

The precursor polymer can be conveniently prepared from the corresponding heteroaryl monomers or derivatives thereof. In one embodiment, the heteroaryl monomer is doubly deprotonated and reacted with an appropriate species $R^1R^2YZ_2$ in the presence of a base, which is then converted to the precursor polymer. $R^1$ and $R^2$ are independently $C_1$-$C_{12}$ alkyl, Y is Si, Ge, Sn, or Pb; and each Z is independently Cl, Br, or I. Suitable bases include, for example alkyl lithium (e.g. t-butyl Li, n-butyl Li, sec-butyl Li), lithium dialkyl amides (e.g. lithium diisopropylamide), or other base of equivalent basicity). The precursor polymer obtained above can be purified by precipitation of the polymer from solvent using a nonsolvent, for example, pentane/hexanes, followed by washing with nonsolvent via continuous procedure, for example, such as Soxhlet extraction.

The precursor polymers can be converted to conductive polymers by an oxidative [Ox] reaction process as outlined in the general schemes (4) and (5) below:

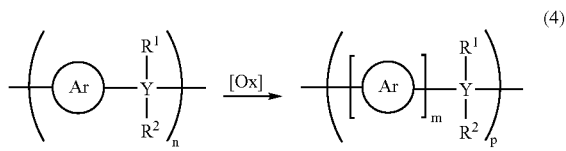

(4)

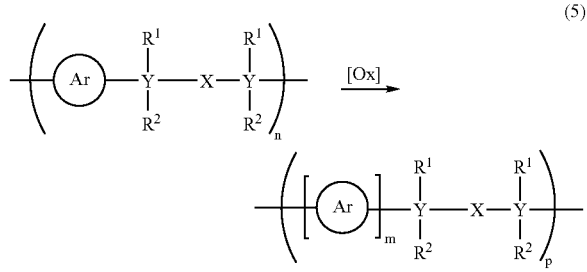

(5)

wherein Ar, $R^1$, $R^2$, X, Y, n, m, and p are as defined previously. The oxidation process may be effected by chemical or electrochemical oxidation or by bromine conversion.

Conversion of the precursor polymer to a conductive polymer results in the conductive polymer retaining some fraction of the Si, Ge, Sn, or Pb units in the backbone structure of the conductive polymer. The resulting conductive polymer has sigma conjugation rendering it different from other conductive polymers prepared from heteroaryl compounds via other processes. For instance, a precursor polymer comprising the structure

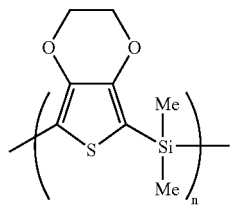

upon conversion by chemical oxidation, electrochemical oxidation, or exposure to bromine and optional heat converts to a conductive polymer having a plurality of EDOT linkages connected by a —SiMe$_2$- unit, and then another plurality of EDOT groups before another —SiMe$_2$- unit is encountered, etc.

Retention of some of the Si, Ge, Sn, or Pb units in the conductive polymer resulting from the conversion of the precursor polymer has some benefits. First, the conductive polymer retains much of its high molecular weight as the number of repeat units is approximately the same between the precursor polymer and the conductive polymer. The high molecular weight provides the conductive polymer with better mechanical properties. Second, the Si, Ge, Sn, or Pb is conjugated with the pi system of the heteroaryls and the silane has a tetrahedral geometry. This serves to have longer conjugation lengths than fully pi conjugated polymers resulting in the conductive polymer prepared from the precursor polymer to have lower oxidation potentials and therefore higher lying highest occupied molecular orbitals (HOMO).

In one method, the precursor polymer is chemically oxidized in a liquid. Suitable oxidants include the iron (III) salts of organic acids, inorganic acids containing organic residues, and inorganic acids, such as FeCl$_3$, Fe(ClO$_4$)$_3$. Oxidants such as H$_2$O$_2$, K$_2$Cr$_2$O$_7$, alkali or ammonium persulfates, alkali perborates, potassium permanganate, NOBF$_4$, or copper salts such as copper tetrafluoroborate may also be used. In addition, bromine, iodine, and oxygen may advantageously be used as oxidants. Persulfates and the iron (III) salts of organic acids and inorganic acids containing organic residues are preferred because they are not corrosive. Examples of suitable iron (III) salts of organic acids are the Fe(III) salts of C$_1$-C$_{30}$ alkyl sulfonic acids, such as methane or dodecane sulfonic acid; aliphatic C$_1$-C$_{20}$ carboxylic acids, such as 2-ethylhexylcarboxylic acid; aliphatic C$_1$-C$_{20}$ perfluorocarboxylic acids, such as trifluoroacetic acid and perfluorooctanoic acid; aliphatic dicarboxylic acids, such as oxalic acid; and aromatic, optionally C$_1$-C$_{20}$ alkyl-substituted sulfonic acids, such as benzenesulfonic acid, p-toluene-sulfonic acid and dodecyl benzenesulfonic acid. Mixtures of the aforementioned Fe(III) salts of organic acids may also be used. Examples of iron (III) salts of inorganic acids containing organic residues are the iron (III) salts of sulfuric acid semiesters of C$_1$-C$_{20}$ alkanols, for example the Fe(III) salt of lauryl sulfate.

Suitable liquids for conducting the oxidative chemical reaction do not adversely affect the reaction, and are preferably inert. Suitable liquids are further selected on the basis of economics, environmental factors, and the like, and may be organic, aqueous, or a mixture thereof. Suitable organic liquids may be aliphatic alcohols such as methanol and ethanol; aliphatic ketones such as acetone and methyl ethyl ketone; aliphatic carboxylic esters such as ethyl acetate; aromatic hydrocarbons such as toluene and xylene; aliphatic hydrocarbons such as hexane; aliphatic nitriles such as acetonitrile; chlorinated hydrocarbons such as dichloromethane; aliphatic sulfoxides such as dimethyl sulfoxide; and the like, as well as mixtures comprising at least one of the foregoing organic liquids. Specifically aqueous liquids are used, that is, a liquid comprising water and/or water-miscible organic liquids such as lower alcohols, acetonitrile, tetrahydrofuran, dimethylacetamide, dimethyl formamide, and the like.

Heat may not be necessary for all conductive polymers in chemical oxidation processes. However, it can be used to speed up the conversion to conductive polymers. Heat can be administered to the polymer either during its exposure to chemical oxidants or after the exposure. Typical reaction conditions include temperatures of 0 to about 100° C. The oxidation is continued for a period of time until the desired conductive polymer is prepared. The degree of conversion varies depending upon the end use application, and is readily determined by one of ordinary skill in the art without undue experimentation. The polymerization time may be a few minutes up to about 48 hours, and depends on a number of factors including the size of the reactor utilized, the reaction temperature, the oxidant utilized, and the like.

In one embodiment, the precursor polymers are converted to conductive conjugated polymers as outlined in the general scheme (4)-(5) above by exposure to bromine. The bromine can be administered by either gas phase exposure of the polymer to bromine or by placing bromine in solution and exposing the polymer to the solution. The precursor polymer may dissolve in the solution or does not dissolve but only swells.

In another embodiment where bromine and heat are used to oxidize the precursor polymers into conductive polymers, the precursor polymers are silyl containing polymers.

In yet another embodiment where bromine and heat are used to oxidize the precursor polymers into conductive polymers, the precursor polymers are Germanium (Ge) containing polymers.

In one embodiment, the precursor polymers are converted to conductive conjugated polymers as outlined in the general scheme (4)-(5) above by a chemical oxidant such as FeCl$_3$ or those previously discussed. When a chemical oxidant is used, the addition of a salt to the reaction solution is used to get adequate oxidation of the precursor polymers. Suitable salts for this purpose include organic soluble salts, inorganic salts, ionic liquids, and polyelectrolytes such as polystyrene sulfonate, polyacrylic acid sodium salt, poly(meth)acrylic acid sodium salt, etc. Exemplary salts include tetra-alkyl ammonium, ammonium, lithium, or sodium cations with tetrafluoroborate, hexafluorophosphate, perchlorate, halides, toluenesulfonate and other aliphatic sulfonate salts, trifluoromethylsulfonate, bistrifluoromethanesulfonimide, sulfates, carbonates or persulfates.

In another embodiment, the (Si, Ge, Sn, Pb) precursor polymers are converted to conductive polymers as outlined in the general scheme (4)-(5) above by chemical oxidant NOBF$_4$.

The precursor polymers, specifically the polyarylsilanes, can be converted to conjugated and conductive polymers in the solid state by employing a water/oxidant solution. When the polymer precursor is cast, a salt such as those previously described, is added during the casting process. The cast polymer precursor can then be oxidized with a suitable oxidant to result in the conductive polymer. This process results in a clean, efficient method to convert to the polymer precursor into a conductive polymer film.

An alternative method for preparing the conductive conjugated polymer is by electrochemical oxidation to convert the precursor polymers to the conductive conjugated polymer. Conventional electrolytic cells can be used for the reaction. In one embodiment, a three-electrode configuration (working electrode, counter electrode, and reference electrode) in operable communication with an electrolyte is used, comprising a working electrode, specifically a button working electrode selected from the group consisting of platinum, gold, vitreous carbon, and indium doped tin oxide working electrodes or non-button electrodes such as the ITO, and platinum flag, a platinum flag counter electrode, and an Ag/Ag+ non-aqueous reference electrode.

Suitable electrolytes include tetraalkylammonium salts, e.g., tetraethylammonium, tetrapropyl ammonium, tetrabutylammonium salts, as well as salts of cations such as lithium trifluoromethansulfonate. Suitable counter ions include but are not limited inorganic ions such as bistrifluoromethylsulfonimide, tosylate, perchlorate, tetrafluoroborate, hexafluorophosphate, and halides such as chloride, bromide, iodide, and organic anions such as tosylate, triflate, trifluoromethylsulfonimide, or polyanions, e.g., polystyrenesulfonate, the anionic form of acrylic acid. Solvents may be used to prepare an electrolyte solution, for example water, ethanol, methanol, acetonitrile, propylene carbonate, tetraglyme, methylene chloride, chloroform, and tetrahydrofuran. Specified solvents are water, acetonitrile, and propylene carbonate.

Other suitable electrolytes include ionic liquids such as butylmethylimidazolium hexafluorophosphate (BMIM $PF_6$) and butylmethylimidizolium tetrafluoroborate (BMIM $BF_4$).

Specified electrolytes include tetrabutylammonium perchlorate/acetonitrile, tetrabutylammonium tetrafluoroborate, tetrabutylammonium hexafluorophosphate/acetonitrile, lithium trifluoromethansulfonate/acetonitrile, and lithium triflate/acetonitrile. Exemplary concentrations of the electrolytes are 0.1 M.

A specified working electrode is a vitreous carbon electrode and the preferred electrolyte is tetrabutylammonium perchlorate/acetonitrile. Another specified working electrode is a platinum button electrode and the preferred electrolyte is lithium trifluoromethansulfonate/acetonitrile.

In one embodiment, the prepared precursor polymer can be coated onto a substrate prior to the oxidation step. The precursor polymer can be applied via ink jet printing, screen printing, roll to roll printing processes, spin coating, meniscus and dip coating, spray coating, brush coating, doctor blade application, curtain casting, spray casting, and the like, to form a layer. The precursor polymer film on the substrate can then be converted to a conductive conjugated polymer in solid state via any one of the processes previously described.

The precursor polymers, specifically the polyarylsilanes, can be converted to conjugated and conductive polymers in the solid state by placing them in a water/salt solution and applying a potential at or above the oxidation of the aryl constituent of the precursor polymer. When the polymer precursor is cast a salt is added during the casting process. Exemplary salts include tetra-alkyl ammonium, ammonium, lithium, or sodium cations with tetrafluoroborate, hexafluorophosphate, perchlorate, halides, toluenesulfonate and other aliphatic sulfonate salts, trifluoromethylsulfonate, bistrifluoromethanesulfonimide, sulfates, carbonates or persulfates.

Optionally, the precursor polymer can be converted to the conducting conjugated polymer which in turn can be further used for preparing films or coating various substrates.

The precursor polymers have been found to be melt processable, such as by compression molding, injection molding, melt spinning, and melt drawing of fibers, and the like.

Another method of preparing fibers includes electrospinning the polymer precursors which can then be converted to conducting conjugated polymer.

In another embodiment, the precursor polymers can be formed into liquid crystals upon heating.

It has been found that the precursor polymers can be either amorphous or semicrystalline depending upon its chemical structure. For example, a precursor polymer containing repeat units of bithiophene and —$Si(Me)_2$- was found to be semicrystalline.

Amorphous precursor polymers can be prepared by substituting the heteroaryl with branched alkyl groups. The branching will reduce the precursor polymer viscosity and can disrupt crystallinity. Such amorphous polymers can potentially be processed using supercritical fluid as a solvent (e.g. supercritical $CO_2$). Additionally, the siloxane-containing (Si—O—Si) precursor polymers are also candidates for processing using supercritical fluids.

The described process of preparing conjugated polymers from the polymer precursors is amenable to a wide variety of aromatic moieties indicating the possibility of making a large number of different conjugated polymers using this technique. Furthermore, solubility and physical properties such as the glass transition temperature of the precursor polymer can be modified by using Si, Ge, Sn, and Pb group with different substitutents attached.

Suitable substrates that can be coated include solid materials (flexible or rigid), and may be, for example, glass, an organic polymer such as a plastic, silicon, a mineral, a semiconducting material, a ceramic, a metal, a metal oxide, and the like, as well as a combination of two or more of the foregoing materials. The substrate may be inherently conductive or may be insulating.

As many of the precursor polymers are soluble yet the conjugated polymers prepared from the precursor polymer are insoluble, preparation of conjugated polymer via electropolymerization in the solid-swollen state can be used to pattern one conjugated polymer on top of another without affecting the previous layer. Such a process is a prerequisite in making multilayer electronic devices.

Films and materials comprising the above-described conductive polymers can be utilized in a variety of applications, including antistatic coatings, electrically conductive coatings, electrochromic devices, photovoltaic devices, light emitting diodes for display applications, hole injection layers for light emitting diodes, near infrared light emitting diodes, transparent conductive coating for indium doped tin oxide replacement, flat panel displays, flexible displays, photoimageable circuits, printable circuits, thin film transistor devices, batteries, electrical switches, capacitor coatings, corrosion resistant coatings, electromagnetic shielding, sensors, biosensors, dimmable mirrors, type III supercapacitors, LED lighting, and the like. The electrical conductivity of the polymers can be readily modified, if necessary, to meet the requirements of any of the previously mentioned application by doping the polymers with conventional dopants such as anions (for p-doped polymers) and cation dopants (for n-doped polymers) known in the art.

The following illustrative examples are provided to further describe how to make and use the polymers and are not intended to limit the scope of the claimed invention.

EXAMPLES

Example 1

Preparation of a Precursor Polymer Prepared from 3,4-ethylenedioxythiophene (EDOT)

EDOT (x mol) was taken in a vacuum dry three-neck 250 ml round bottom flask followed by cannulating anhydrous tetrahydrofuran (THF). n-Butyl lithium (n-BuLi) (2× mol) was added dropwise into the reaction mixture at −78° C. (dry ice-acetone bath). The reaction mixture was stirred for one hour at room temperature followed by dropwise addition of dialkyldichlorosilane (1× mol) over a period of 15 minutes. The reaction was quenched after stirring at room temperature for 48 hours under nitrogen atmosphere using water. The EDOT precursor polymer was obtained by precipitating out from solution using n-pentane. The EDOT precursor polymer 1A was dried under vacuum, and purified by washing with pentane or pentane-THF (50-50) mixture.

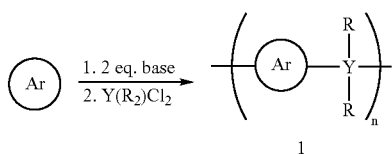

Additional heteroaryls were prepared into precursor polymers. All precursor polymers were analyzed by $^1$H-NMR, $^{13}$C-NMR, differential scanning calorimetry (DSC), and Thermo-Gravimetric Analysis. A summary of the precursor polymers and their physical properties (number average molecular weight (Mn), polydispersity index (PDI), glass transition temperature ($T_g$), and onset of thermal degradation) are provided in Table 1.

the reaction flask. The solution was stirred for 3 minutes and immersed into a dry ice/acetone slurry at −78° C. Using a syringe, 0.0142 moles (6.23 mL) of 2.28M nBuLi was added into the stirred reaction vessel drop wise over a period of twenty minutes. The reaction mixture was maintained at this temperature for 45 minutes after which it was slowly brought to 0° C. using a water/ice slurry. The reaction mixture was maintained at this temperature for an additional 45 minutes before being brought to room temperature by removal of the ice bath. The reaction was maintained at room temperature for another 30 minutes. To the reaction mixture was added 1.224 g (0.81 mL) of dichlorodimethylgermane via a syringe over a period of one hour. The reaction was then stirred for an additional 96 hours. The reaction was terminated by the addition of 0.5 mL methanol and the reaction mixture content was poured into a 100 ml beaker with 50 ml pentane. The resulting precipitate was isolated by vacuum filtration. The residue washed with more pentane then taken into 10 mL of hot DMF with difficulty. This solution was then poured into 50 ml deionized water at which point a tan colored precipitate formed. The precipitate washed with hexanes several times before being dried in a −50 Kpa vacuum oven at 100° C. for 24 hours.

Preparation of poly (50-50-dimethyl silyl dimethylgilyl, EDOT) (1J) was performed similarly to the procedure to prepare IH, although dichlorodimethyl germane and dichlorodimethyl silane were added simultaneously to ensure the contents in the reaction mixture had approximately the same

TABLE 1

| Precursor polymer | Ar | R | Y | Mn | PDI | $T_g$ (° C.) | Onset of thermal degradation (° C.) |
|---|---|---|---|---|---|---|---|
| 1A | EDOT | —CH$_3$ | Si | 50,600 | 2.08 | 68 | 290 |
| 1B | bis-3,4-ethylenedioxy-thiophene | —CH$_3$ | Si | — | — | 55 | 200 |
| 1C | BEDOT-N-methylcarbazole | -nC$_8$H$_{17}$ | Si | 85,200 | 1.75 | 35 | 250 |
| 1D | thiophene | —CH$_3$ | Si | — | — | — | — |
| 1E | bithiophene | —CH$_3$ | Si | — | — | 56 | 442 |
| 1F | thieno[3,4-b]thiophene | —CH$_3$ | Si | 5,000 | — | — | — |
| 1G | EDOT | | —Si(Me$_2$)—O—Si(Me$_2$)— | 4,000 | — | — | — |
| 1H | EDOT | —CH$_3$ | Ge | — | — | — | 137 |
| 1I* | EDOT | —CH$_3$ | Si and Ge | 20,000 | 1.8 | — | — |
| 1J* | EDOT | —CH$_3$ | Si and Ge (50:50) | — | — | — | 114 |
| 1K* | EDOT | —CH$_3$ | Si and Ge (25:75) | — | — | — | 98 |
| 1L* | EDOT | —CH$_3$ | Si and Ge (75:25) | — | — | — | 86 |

*copolymer

Precursor polymer 1A was found to be soluble in THF, methylene chloride, chloroform, DMF, DMSO and other organic solvents. Precursor polymer 1B is soluble in boiling DMF and DMSO, and precipitates out from the solution on cooling. Precursor polymer 1C is soluble in THF, chloroform, and DMF on heating and remains soluble upon cooling.

Precursor polymers 1D to 1G were also prepared according to the procedure of Example 1A. Preparation of polydimethylgilyl EDOT (1H): To a 50 mL three neck round bottomed flask with a Teflon stir bar, two Teflon stoppers and a Schlenkline connection to a nitrogen blanket was charged 0.007035 moles (1 g, 0.75 mL) of 3,4-ethylenedioxythiophene using a 1 mL syringe under a nitrogen blanket. Freshly distilled dry THF (12 mL) under a nitrogen blanket was cannulated into amount of dichlorodimethylgermane and dichlorodimethylsilane. The resulting polymer 1J is soluble in chloroform.

Preparation of poly (25-75-dimethyl silyl dimethylgilyl, EDOT) (1K) was performed similarly to the procedure to prepare IH, although dichlorodimethyl germane and dichlorodimethyl silane were added simultaneously to ensure the contents in the reaction mixture had approximately a 1:3 ratio of dichlorodimethyl silane:dichlorodimethyl germane.

Preparation of poly (75-25-dimethyl silyl dimethylgilyl, EDOT) (1L) was performed similarly to the procedure to prepare IH, although dichlorodimethyl germane and dichlorodimethyl silane were added simultaneously to ensure the contents in the reaction mixture had approximately a 3:1 ratio of dichlorodimethyl silane:dichlorodimethyl germane.

Polymer precursors 1H and 1J-1L were analyzed by thermogravimetrical analysis (TGA) and differential scanning calorimetry (DSC).

Example 2

Electrochemical Oxidation of EDOT Precursor Polymer

The EDOT precursor polymer 1A was converted to an EDOT polymer 2A containing units of dimethylsilane via an electrodesilylation process.

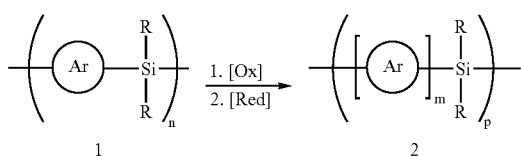

It should be noted that after Ox the aromatic units are in an oxidized/conductive state and the reduction is only necessary to give the repeat unit as shown in the scheme where it is now a repeating aromatic structure that is, generally, insulating or having a larger band gap. A three-electrode cell containing platinum button as working, platinum flag as counter, and Ag/Ag+ non-aqueous as a reference electrode was used in the presence of monomer free 0.1 M tetrabutylammonium hexafluorophosphate/acetonitrile (TBAPF$_6$/ACN) electrolyte solution. A reference electrode was calibrated using ferrocene-ferrocenium redox, and found to be 0.457 vs. NHE. The EDOT precursor polymer 1A was drop cast onto the Pt button, and kept in electrolyte for approximately 10 minutes prior to the electrochemical polymerization. Electrochemical polymerization was performed by using cyclovoltammetry at a scan rate of 50 mV/s. EDOT polymer precursor 1A showed an oxidation process with an onset at 0.88 V and a peak at 1.2 V (vs. Ag—Ag+ non-aqueous reference) which corresponds to the oxidative polymerization of EDOT to form PEDOT. On reversing the scan in cathodic direction, two broad reduction processes observed corresponding to the reduction of oxidized form of 2A obtained in the previous cathodic scan to the neutral form. This was also confirmed by visual inspection of precursor film which changed color from colorless to transparent light blue after polymerization, and then to transparent dark blue in the neutral form. During the second scan, a large decrease in current corresponding to the oxidative polymerization of precursors indicates the conversion of 1A into 2A in the first scan. 2A showed redox behavior similar to PEDOT (obtained via electrochemical polymerization of EDOT) indicating the formation of similar conjugated species in both cases.

Separately, the precursor polymer can be dissolved in methylene chloride and 0.1M salt and perform the electrochemical conversion of the polymer from solution onto an electrode.

FIG. 1 is an example of the electrochemical oxidative conversion of precursor polymer 1A in the solid state. The electrolyte used was 0.1M lithium trifluoromethansulfonate/acetonitrile performed on a Pt button.

Precursor polymer 1B was also oxidatively polymerized to 2B with an onset at 0.34 V and peak potential at 0.66 V similar to that of bis-3,4-ethylenedioxythiophene (BEDOT), and 2B showed redox behavior similar to the PEDOT obtained from EDOT or 1A. The lower oxidation potential of 1B as compared to 1A helps in synthesizing PEDOT at lower oxidation potential.

Electrochemical conversion of precursor polymer 1C into 2C was also performed in a similar way with an onset of oxidation peak at 0.34 V and a peak at 0.61 V. The complete conversion of 1C into 2C in first CV scan is evident by the large decrease in current corresponding to the monomer oxidation and similar reduction current in the first and second scans. 2C showed redox behavior similar to the polycarbazole obtained from BEDOT-N-methylcarbazole (BEDOT-NMCz) indicating the formation of similar conjugated species in both the cases.

Figure 2:
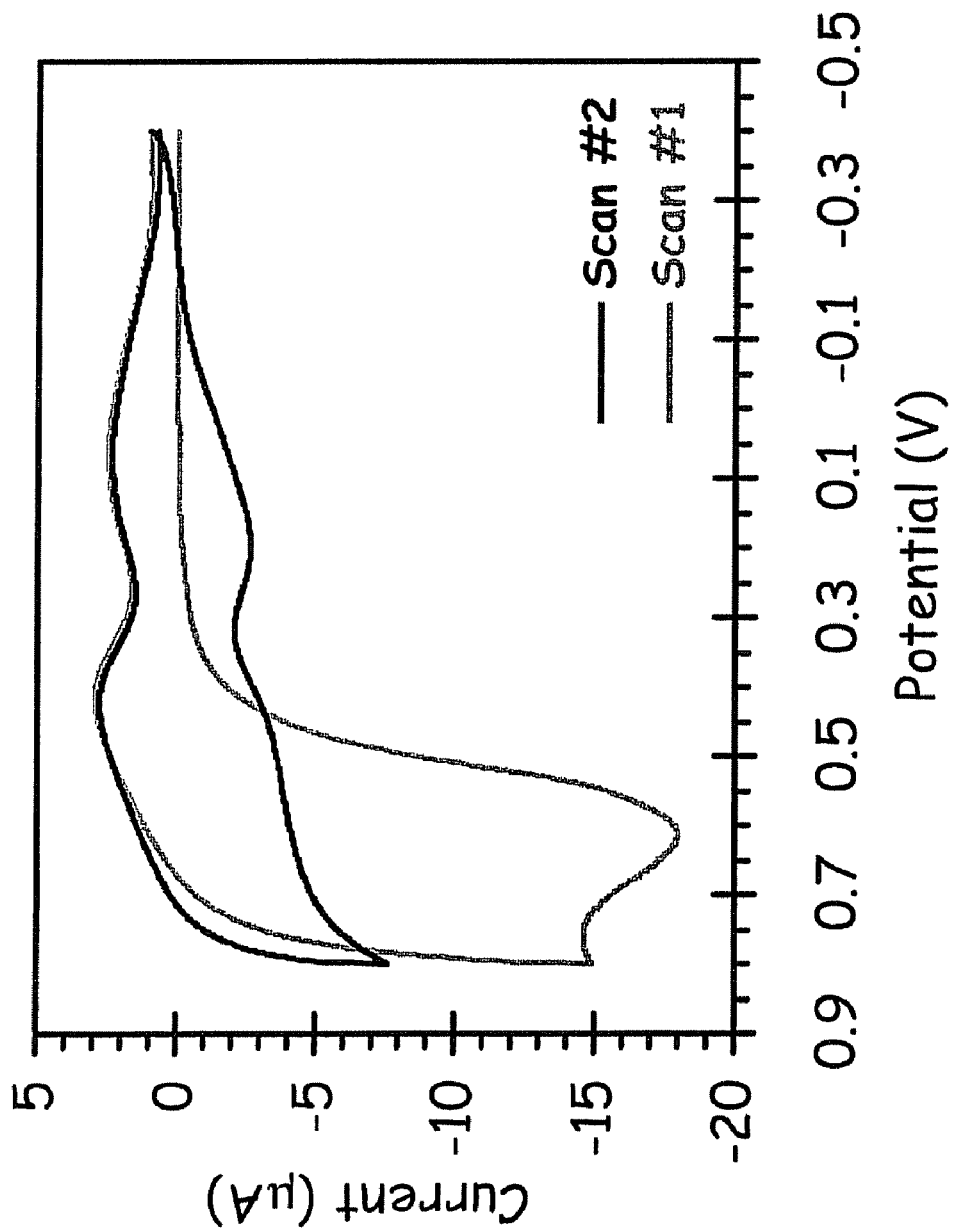
FIG. 2 illustrates the solid-state conversion of a precursor polymer containing bis-3,4-ethylenedioxythiophene N-methylcarbazole (BEDOT-NMCz) units and dimethylsilyl units to a conductive conjugated polymer.

FIG. 2 is an example of the electrochemical oxidative conversion of precursor polymer 1C in the solid state. The electrolyte used was 0.1M lithium trifluoromethansulfonate/acetonitrile performed on a Pt button.

Figure 4:
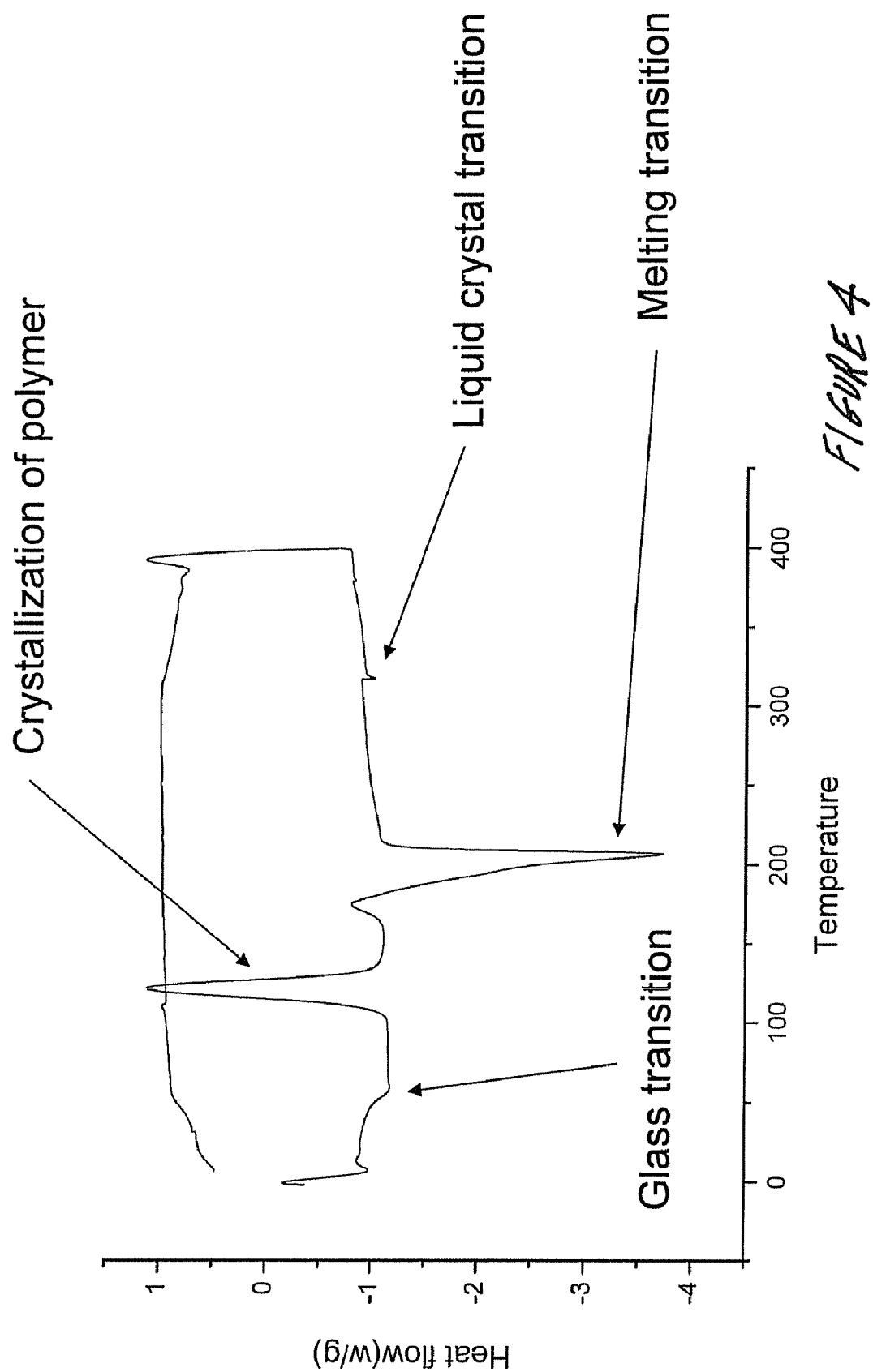
FIG. 4 illustrates a DSC scan of a precursor polymer containing bithiophene units and dimethylsilyl units.
Figure 5:
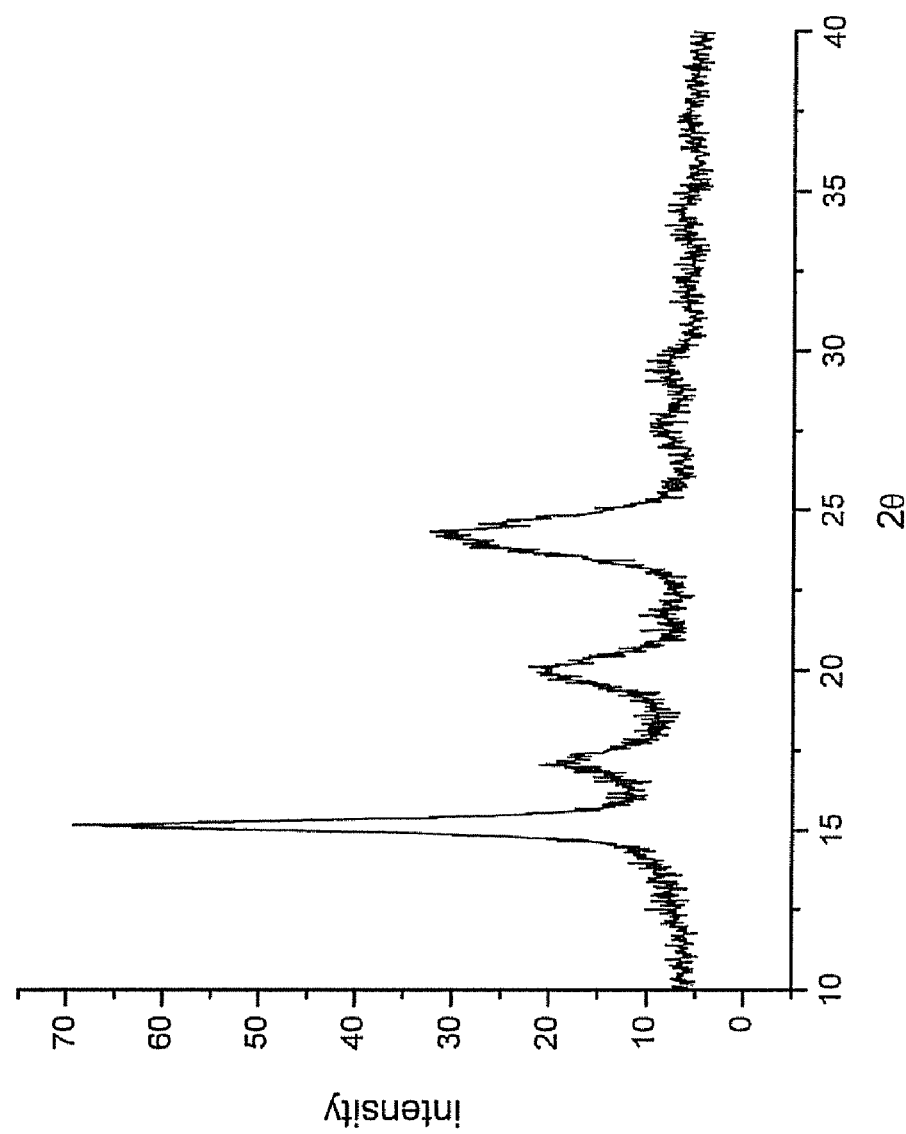
FIG. 5 is a Wide angle x-ray scattering (WAXS) diffractogram of a precursor polymer containing bithiophene units and dimethylsilyl units.

Precursor polymers 1D, 1E, 1F, 1H, and 1I were also successfully converted to conjugated polymers according to the procedure of Example 2. Precursor polymer 1E was analyzed by DSC and is shown to be semicrystalline as indicated by the melting transition (FIG. 4, second scan, heat rate 10° C./minute). At higher temperatures, the melt orders into a liquid crystalline phase. Wide angle x-ray scattering (WAXS) of precursor polymer 1E indicates crystallinity and lattice spacing of the polymer chains (FIG. 5).

Example 3

In Situ Spectroelectrochemistry of BEDOT-NMCz Precursor Polymer

A 0.1 μm thick film of 1C was spin cast onto ITO-coated glass from 0.1% w/v solution in DMF, and electrochemically polymerized to 2C as described above. ITO-glass coated with 2C was used as a working electrode in a three electrode cell along with an ITO-coated glass as counter and Ag—Ag+ non-aqueous as reference electrode in the presence of 0.1 M TBAPF$_6$/ACN electrolyte. The other ITO-coated glass used as counter electrode was kept at 0.5 cm apart from the working electrode, and Ag/Ag+ reference electrode was kept in between them inside the UV-cuvette. Chronocoulometry technique was used to keep the potential constant during the optical measurements. 1C did not show any absorption peak in visible region while 2C in the neutral state (at a potential of −0.4 V vs. Ag—Ag+ non-aqueous) showed an absorption peak at 427 nm (2.9 eV) indicating the formation of conjugated polymer. The onset of absorption peak is observed at 501 nm (2.48 eV) corresponding to π to π* transition of conjugated polymer. 2C showed a red-shift of $\lambda_{max}$ to 610 nm (2.03 eV) (on applying +0.4 V (vs Ag—Ag+)) corresponding to the oxidized form of conjugated polymer 2C. These results are in agreement with the reported value for the polymer obtained from the monomer BEDOT-NMCz confirming the formation of conjugated polymer from the precursor 1C. Conjugated polymer obtained from precursors 1A and 1B also showed optical properties similar to the polymer obtained from corresponding monomers.

Example 4

Oxidative Polymerization of Precursor Polymers 1H and 1J-1L

A thin film of the precursor 1H was cast onto the working electrode from solution. Using a 1×1 cm$^2$ platinum flag as a counter and Ag/Ag+ as a reference that was calibrated to be 0.45 V vs normal hydrogen electrode (NHE) using the ferrocene/ferrocenium couple, cyclic voltammetry was performed in a 1M TBAPF$_6$/ACN supporting electrolyte. It was found the higher the content of Si in the copolymer, the higher the oxidation potential of the precursor polymer. Similar experiments were performed on precursor polymers 1J-1L, and the peak potentials for the polymer precursors using platinum and glassy carbon working electrodes is provided in Table 2.

TABLE 2

| Electrode | 1H | 1J | 1K | 1L |
|---|---|---|---|---|
| Glassy Carbon | 1.165 | 1.195 | 1.20 | 1.245 |
| Platinum | 1.160 | 1.235 | — | — |

Example 5

Conversion of Precursor Polymers with Bromine (Br$_2$)

Conversion of the precursor polymers to conjugated polymers can be effected by either gas phase exposure of the precursor polymer to bromine or by exposing the precursor polymer to a solution containing bromine. Heat can be added to increase the rate of conversion. Precursor polymers 1A, 1B, 1C, 1D, 1E, 1F, and 1I were successfully converted to conjugated polymers using bromine conversion.

Figure 3:
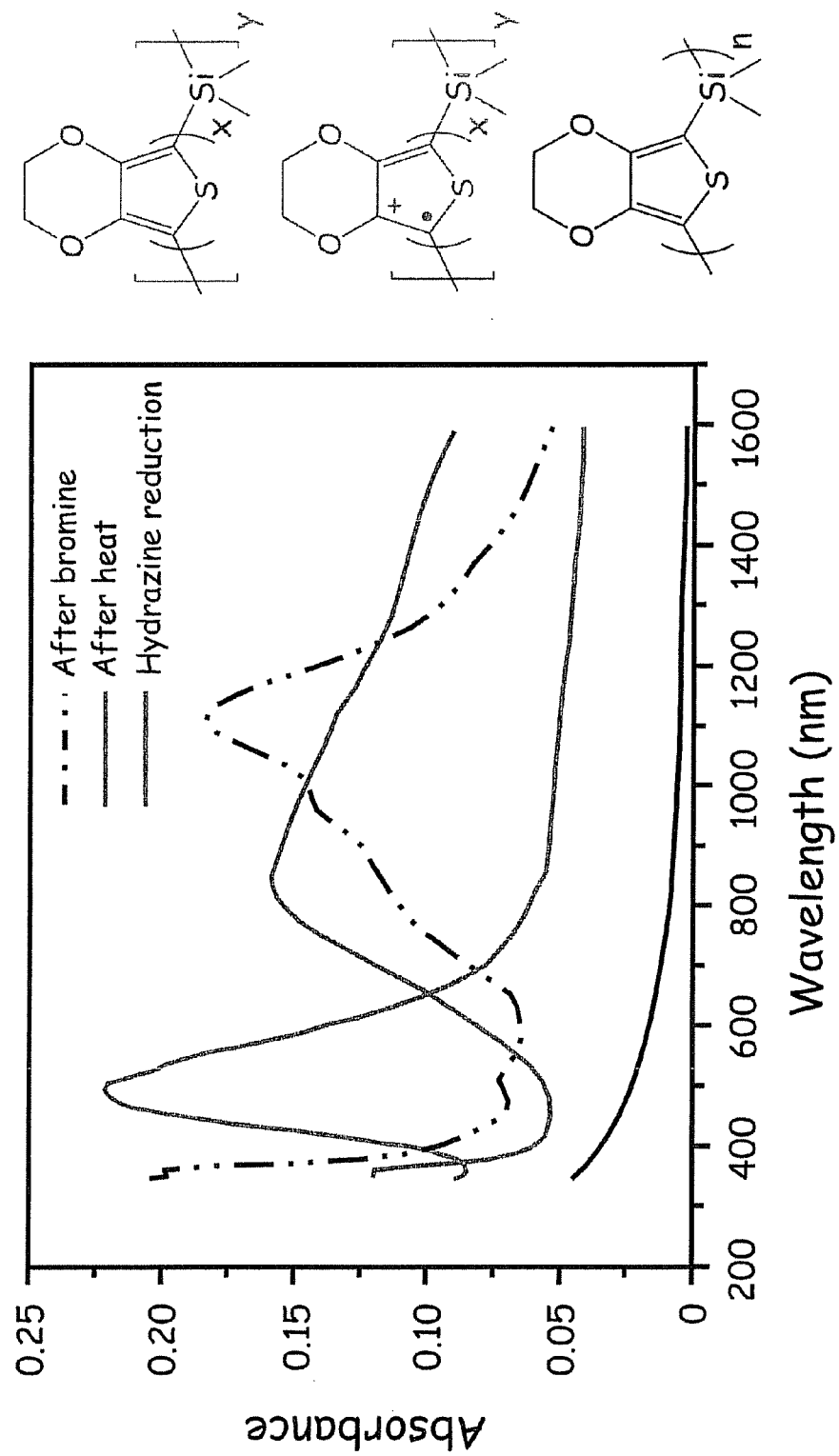
FIG. 3 is a scan of the conversion of a precursor polymer containing 3,4-ethylenedioxythiophene (EDOT) units and dimethylsilyl units to a conjugated polymer using bromine vapor/heat conversion followed by reduction with hydrazine.

FIG. 3 is a scan of the conversion of precursor polymer 1A to conjugated polymer 2A using bromine conversion followed by reduction with hydrazine.

Precursor polymer 1B was converted to conjugated polymer 2B using bromine vapor and heat. The switching response of conjugated polymer 2B was determined using a Pt button and 0.1M electrolyte/ACN solution. 2B was found to have a switching response of about 300 switches in 15 seconds with 100% retention of charge.

Precursor polymer 1H was converted to conjugated polymer 2H according to the following procedure: A thin film was spin cast onto quartz from a dilute solution of 1H in THF and its UV-Vis-NIR spectra taken. The film shows negligible absorbance in the NIR and visible regions. A strong peak corresponding to π and/or σ-π* transitions of the EDOT noted at around 266 nm. On bromine exposure, the transparent film turns brown that turns into dark blue with time and becomes highly absorbent in the NIR region exhibiting a broad bimodal peak centered at 1081 and 938 nm that tails into the visible region. The peak in the UV region becomes red-shifted to 281 as well as being more absorbent. Subjecting this film to heat (60° C. 2 min), it becomes deep blue. Its spectrum shows that the two peaks merge with maximum absorbance at 953 nm. The tail in the visible region as well as the peak at 281 nm diminish. This result is analogous to doped PEDOT. Chemical reduction was then performed by exposing the film to hydrazine vapor for 2 minutes. The film became highly absorbent in the UV and visible regions with a tail extending to the NIR region. The film gives a highly transparent light pink color with a corresponding $\lambda_{max}$ of 509 nm This phenomenon is typical of reduced PEDOT. Similar results are obtained for the precursor polymers 1J-1L under the same treatment.

Example 6

Optoelectronic Properties of 2H and 2J-2L

In order to investigate the nature of the polymer obtained on potentiostatic (1.2V reference Ag/Ag$^+$ 0.455V). 35 seconds) conversion of 1H, 1J, 1K and 1L onto ITO coated glass to give conjugated polymers 2H, 2J, 2K and 2L respectively, spectroelectrochemical studies where taken and compared to that of PEDOT. The results show that the wavelength for maximum absorption for PEDOT can be varied in accordance to the germanium/silicon ratio of the polymer.

Example 7

Melt Processing

Melt-drawn fibers of precursor polymer 1E were prepared by heating the precursor polymer above its melt temperature and drawing fibers from the melt using a spatula.

Example 8

Melt Processing and Electrochemical Conversion

Precursor polymer 1E was melt processed onto a Pt button and then submerged into 0.1 M TBAPF6/ACN electrolyte solution. Electrochemical polymerization was performed by using cyclovoltammetry at a scan rate of 50 mV/s.

Example 9

Preparation of Silane Precursor Polymers Containing Bis-EDOT-Thiophene (BEDOT-T) and bis-EDOT-Benzene (BEDOT-B) and Their Oxidative Conversion to Conductive Polymers Silane precursor polymers containing bis-EDOT-Thiophene (BEDOT-T) and bis-EDOT-Benzene (BEDOT-B) were prepared by preparing a solution of the monomer 3 (BEDOT-T (3a) or BEDOT-B (3b)) (1 equiv.) in anhydrous THF under nitrogen was cooled to −78° C. via a dry ice/acetone cooling bath. n-Butyllithium (2 equiv.) was added dropwise into the precooled solution via syringe. After 1 hr, the reaction mixture was warmed to 0° C. via ice/water bath for 15 min and then dichlorodimethylsilane (1 equiv.) was added dropwise into this solution. The ice bath was removed after 30 min. The reaction solution was stirred for 3 days at room temperature. The crude polymer (4) was precipitated out of the reaction mixture by pouring the mixture into n-pentane. The resulting precipitate was purified by soxhlet extraction using ACN as the solvent. Both precursor polymers 4a and 4b were found to be soluble in tetrahydrofuran and chloroform. Precursor polymer 4a GPC: number-average molecular weight, M$_n$=80,667. Precursor polymer 4b GPC: number-average molecular weight, M$_n$=82,760.

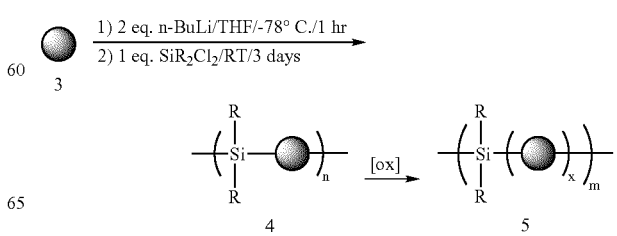

-continued

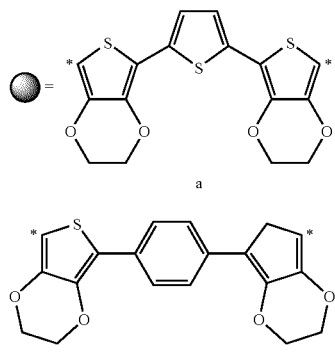

R = n-C$_8$H$_{17}$

The precursor polymers 4a and 4b were converted to conductive polymers 5a and 5b by solid state oxidative conversion. A 1-wt % solution of precursor polymer, 4a or 4b, in CH$_2$Cl$_2$ was prepared. A thin film of precursor was coated from this solution by dipping a platinum button (2 mm diameter) in the precursor polymer/CH$_2$Cl$_2$ solution followed by air-dry for approximately 10 min. The electrochemical conversion of precursor was then carried out at a scan rate of 100 mV/s in 0.1 M TBAPF$_6$/ACN (10 mL) solution via cyclic voltammetry.

The electrochemical experiments were performed using a three-cell configuration in 0.1M TBAPF$_6$/ACN with a CHI 400 potentiostat. The reference electrode was a nonaqueous Ag/Ag$^+$ electrode consisting of a silver wire immersed in a glass capillary body fitted with a Vycor tip and filled with 0.1M silver nitrate (AgNO$_3$)/ACN and 0.1M TBAPF$_6$/ACN solutions. The Ag/Ag$^+$ reference electrode was calibrated to be 0.4385V vs. the normal hydrogen electrode (NHE) using a 10 mM ferrocene/ACN solution. A 1 cm$^2$ platinum flag was used as a counter electrode in all electrochemical measurements. The "conventional electrochemical polymerization" is the method by which the monomer is dissolved in electrolyte solution and a potential is applied to the working electrode by which oxidation of the monomer takes place to form corresponding polymer. After polymerization, the polymer-coated Pt working electrode washed with ACN to remove residual monomers and oligomers. The cyclovoltammogram of the polymer was obtained in monomer-free solution in order to isolate the electrochemical processes of the polymer. In electrochemical solid-state oxidative cross-linking ("SOC") processing, there was no need to clean the polymer due to solid-state conversion and monomer-free solution during the conversion.

Precursor polymer 4a was drop-casted onto a platinum working electrode and then dried in air for 10 minutes. Precursor polymer 4a was converted into the conjugated polymer 5a by electrodesilylation in solid-state. 4a showed an oxidation having an onset at 0.3V and a peak at 0.6V. Upon reversing the scan in the cathodic direction, two reduction peaks at 0.39V and −0.05V were observed which corresponds to the reduction of oxidized and conductive form to the neutral form of poly(5a). In the second anodic scan, the disappearance of the peak at 0.6V indicated the complete conversion of precursor polymer 4a to polymer 5a and instead displayed broad oxidation peaks at 0.19 V and 0.49V. Comparison of the CVs from 4a and the polymer obtained from conventional polymerization of the monomer, 3a, similar oxidation peaks were found with the precursor polymers having ~0.1V increase in the oxidation peak.

The conversion of precursor polymer 4a into conductive form 5a was visually observed by the color change from brown to blue color. During the reduction process, green, brown, and finally orange colors were seen at 0.3V, 0.2V and −0.4V, respectively. The colors in different potentials remained stable after corresponding potentials were applied to the films on the Indium doped tin oxide (ITO) coated glass (dimensions 7 mm×50 mm×0.7 mm, Rs=15-25Ω, unpolished float glass) glass-slide via chronocoulometry.

Precursor polymer 4b was converted into the oxidized form 5b by using the same three-electrode assembly as used for conversion of 4a into 5a. 4b showed typical redox behavior with an onset at 0.3V and a peak at 0.6V. On reversal of scan in the cathodic direction, reduction of oxidized 4b was observed with a peak at 0.31V. In the second scan, the onset of oxidation of 5b was observed at 0.1V and the corresponding peak at 0.37V. Furthermore, there is no remaining polymerizable units on the working electrode due to absence of the oxidation peak of the precursor polymer. Additionally, purple and reddish yellow colors were observed upon oxidation and reduction of 5b, respectively.

For comparison, poly(3a) and poly(3b) were prepared via conventional oxidative electrochemistry. The monomer (3a or 3b) was electrochemically polymerized from 10 mM monomer solution at a scan rate of 100 mV/s in 0.1 M TBAPF$_6$/ACN (10 mL) solution via cyclic voltammetry. The resulting polymer was washed several times with ACN. After rinsing process, this working electrode was inserted into the monomer free solution of 0.1 M TBAPF$_6$/ACN (10 mL) and then the polymer voltagrams were obtained at a scan rate of 100 mV/sec. The cyclic voltammetry of poly(3b) displayed similar pattern for the oxidation process with the SOC polymer 4b. However, the peak for the reduction of poly(3b) was observed at 0V which was 0.3V less than the reduction peak of 4b.

To compare the redox behaviors of monomers and corresponding precursor silane polymers, all cyclic voltammograms were performed in the same environment via conventional electrochemical polymerization onto platinum working electrode in 0.1M TBAPF$_6$/electrolyte/dichloromethane. It was observed that both precursor polymers have the same oxidation onset and peak potentials with the corresponding monomers. A 0.1V higher potential of the reduction peaks of the precursor polymers was the only difference with the monomers.

The precursor polymers were spin-coated onto the ITO-Glass slide, and poly(3a) and poly(3b) were deposited onto ITO/Glass slide from 10 mM monomers in 0.1M TBAPF$_6$/ACN solutions via conventional electrochemical polymerization. The UV-Visible spectra of oxidized and reduced films of polymers were obtained after dipping the films into 10 mM FeCl$_3$ and 10 mM hydrazine in TBAPF$_6$/ACN solution for 1 min., respectively.

Upon UV-Vis-NIR spectra analysis, 5a with poly(3a) and 5b with poly(3b) have the comparable patterns of the spectra in both oxidized and reduced forms. Oxidized forms of 5a and poly(3a) have a main peak at 1164 nm and 1280 nm, respectively with a shadow peak around 775 nm. The spectra of reduced state of these polymers displayed close $\lambda_{max}$ of 524 nm and 538 nm, respectively. In addition, there is another peak of 900 nm for the reduced state of poly(3a) which was not in the spectrum of 5a. In oxidized state, there is a blue shift for the 5a which supports the higher oxidation potential of this silane polymer observed by cyclic voltammetry. In addition, both data show a shorter conjugation resulted by 5a.

The oxidation forms of 5b and poly(3b) have two peaks of 632 nm, 1318 nm and 592 nm, 1099 nm, respectively. For the reduced states of these polymers, the 5b and poly(3b) have λmax of 461 nm and 454 nm with shadow peaks of 875 nm and 894 nm, respectively. In contrast to 5a, there is a red shift for 5b in oxidized state.

4a and 4b films were fabricated via spin-coating on a normal glass substrate which had 2 mm-wide four gold leads with 2 mm distance from each other. The thicknesses of polymers were measured by optical profilometry after conversion of insulating polymers to conductive ones by dipping into 10 mM $FeCl_3$ in 0.1M $TBAPF_6$/ACN solution.

After oxidizing 0.3 μm thick films, 5a and 5b had conductivities averaging ca. $10^{-2}$ S/cm (5a=$10^{-2}$ and 5b=$10^{-2}$). After iodine ($I_2$) doping of neutral films for three days, 5a showed conductivity of 0.8 S/cm, but 5b showed the same conductivity as oxidized film by using $FeCl_3$. $I_2$ doped films retained the same conductivity after films were open to air exposure for two weeks. The substrate used for the conductivity measurements consisted of four 5 mm-wide evaporated gold leads deposited onto glass slide. The distance between each set of gold leads was 5 mm. All films were prepared by spin-coating solution onto the aforementioned slide. Insulating polymers on the glass substrate were converted to conductive polymers by just dipping the substrate onto 10 mM $FeCl_3$ in 0.1M $TBAPF_6$/ACN solution for 1 minute before measuring conductivities. Electrical conductivities were measured using a four probe collinear array utilizing a Keitley Instruments 224 constant current source and a 2700 multi-meter. The current was applied across the outer gold leads and then voltage was measured across the inner leads. A minimum of three current measurements was applied and the resistance values were found to be the same at these different current levels.

Thermal Analysis. The glass transition temperatures ($T_g$) of the two precursor polymers (4a, 4b) and corresponding conducting polymers (5a, 5b) were studied by differential scanning calorimetry (DSC) using a TA Instruments DSC 2920. In DSC, the samples were heated to 100° C. and immediately cooled until they reach to −50° C., and then DSC analysis was performed by heating at a scan rate of 10° C./min. The $T_g$ of the polymers are shown in Table 3.

Thermal stability of the polymers was also studied by thermal gravimetric analysis (TGA) using Hi-Res TGA 2950. Table 3 contains the decomposition temperatures of the polymers, which illustrate the thermal stability of the polymers with higher amounts of silane units in the system

TABLE 3

|  | 4a | 5a | 4b | 5b |
|---|---|---|---|---|
| $T_g$ (° C.) | 39.89 | 42.47 | 48.79 | 37.41 |
| $T_{5\% \text{ weight loss}}$ (° C.) | 289.69 | 245.28 | 345.19 | 248.28 |

Example 10

Solid State Conversion of Silane Precursor Polymer Containing bis-EDOT-Thiophene (BEDOT-T) in Water

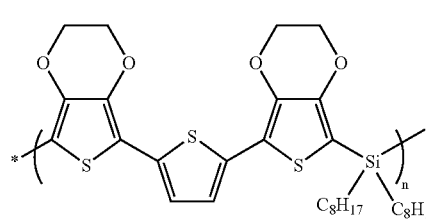

In an electrochemical conversion of BEDOT-T (6a, 80 kDa) in the solid state 62.0 mg of BEDOT-T (6a) was dissolved in a solution of 0.1M $TBAPF_6$/dichloromethane (DCM) (10 ml). The resulting solution was then drop cast onto a platinum electrode and the DCM was allowed to evaporate to provide a film of the precursor polymer on the platinum electrode. The electrode with coating was then immersed into brine (saturated NaCl in water) along with a Ag/AgCl reference electrode and a platinum flag counter electrode. In three separate examples the polymer was treated to an oxidation above that of the BEDOT-T oxidation with one experiment having an upper potential limit of 0.95V, a second experiment with upper potential limit of 0.85V, and a third experiment with an upper potential limit of 0.75 V. Characteristic of all three experiments is that the current at lower potential of <0.65 V continues to increase in intensity with each excursion above the BEDOT-T oxidation. This is indicative of a conjugated polymer forming and the lower potential redox process is the corresponding oxidation/reduction for the conductive polymer 6b.

Other experiments replaced the brine of the foregoing example with i) 10 mM NaCl in water or ii) a mixture of 10 mM NaCl and 10 mM Li trifluoromethanesulfonate in water. Still yet other experiments used an indium doped tin oxide electrode in place of the platinum electrode. In still other experiments, the polymer precursor of the foregoing example was replaced with a polymer precursor comprising 3,4-ethylenedioxythiophene-dimethylsilyl repeat units.

In a chemical conversion of BEDOT-T (6a) in the solid state 62.0 mg of BEDOT-T (6a) was dissolved in a solution of 0.1M $TBAPF_6$/dichloromethane (DCM) (10 ml) solution. A film of the polymer was then prepared on a glass microscope slide by saturating the glass slide with the polymer solution followed by spin casting at 1000 rpm. In three separate examples the precursor polymer was treated with one of the following oxidants to result in the conductive polymer 6b: 50 mM ammonium persulfate in water, 50 mM ferric sulfate in acetonitrile, and 50 mM ferric tosylate in water.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising", "having", "including", and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated

What is claimed is:

1. A precursor polymer, comprising:
a polymer according to the structure:

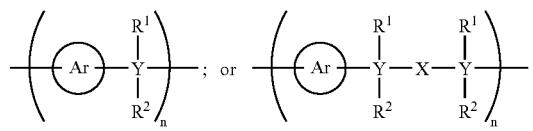

wherein
Ar is a heteroaryl group;
each occurrence of $R^1$ and $R^2$ is independently $C_1$-$C_{12}$ alkyl, $C_1$-$C_{12}$ haloalkyl, or aryl;
X is O, S, $(YR^1R^2)_x$, or $(CR^aR^b)_x$ wherein x is 0, 1, 2, 3, or 4, and $R^a$ and $R^b$ are independently hydrogen, $C_1$-$C_{12}$ alkyl, or $C_1$-$C_{12}$ haloalkyl;
each occurrence of Y is independently Si, Ge, Sn, or Pb; and
n is about 10 or greater;
copolymers thereof or blends comprising at least one of the foregoing polymers, wherein when the polymer is according to structure

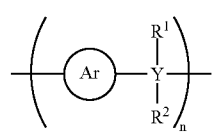

and Ar is thiophene, bithiophene, or terthiophene, then Y is Ge, Sn, or Pb;
wherein when the polymer is according to structure

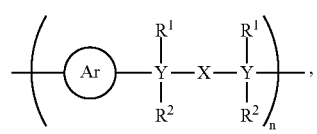

Y is Si, Ar is furan, pyrrole or

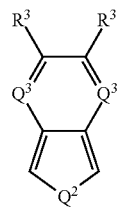

(V), $Q^2$ is S, $Q^3$ is CH, and $R^3$ is hydrogen, the $R^1$ and $R^2$ are independently n-propyl, isopropyl, n-butyl, 3-methylbutyl, t-butyl, n-pentyl, sec-pentyl, cyclopentyl, cyclohexyl, octyl, $C_1$-$C_{12}$ haloalkyl, or aryl;
wherein when the polymer is according to structure

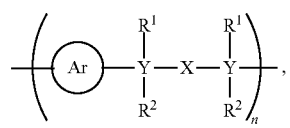

X is $(YR^1R^2)_x$, and Ar is thiopene, bithiophene, or terthiophene, then Y is Ge, Sn, or Pb; and
wherein when the polymer is according to structure

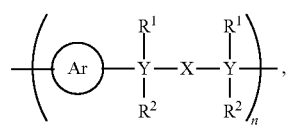

X is $(YR^1R^2)_x$, X is O, Y is Si, Ar is furan, pyrrole or

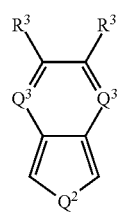

(V), $Q^2$ is S, $Q^3$ is CH, and $R^3$ is hydrogen, then $R^1$ and $R^2$ are independently n-propyl, isopropyl, n-butyl, 3-methylbutyl, t-butyl, n-pentyl, sec-pentyl, cyclopentyl, cyclohexyl, octyl, $C_1$-$C_{12}$ haloalkyl, or aryl.

2. The polymer of claim 1, wherein Ar is
a heteroaryl having the general structure (I), (II), and (III):

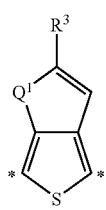

(I)

-continued

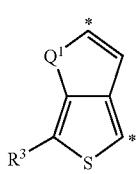
(II)

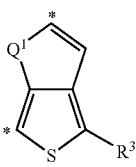
(III)

wherein $Q^1$ is S or O; and $R^3$ is hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (IV):

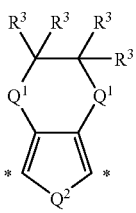
(IV)

wherein each occurrence of $Q^1$ is independently S or O; $Q^2$ is S, O, or N—$R^4$ wherein $R^4$ is hydrogen or $C_1$-$C_6$ alkyl; and each occurrence of $R^3$ is hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (V):

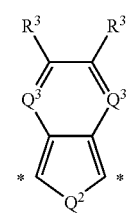
(V)

wherein $Q^2$ is S, O, or N—$R^4$ wherein $R^4$ is hydrogen or $C_1$-$C_6$ alkyl; each occurrence of $Q^3$ is independently CH or N; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (VI):

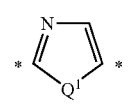
(VI)

wherein $Q^1$ is S or O;

a heteroaryl having the general structure (VII):

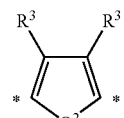
(VII)

wherein $Q^2$ is S, O, or N—$R^4$ wherein $R^4$ is hydrogen or $C_1$-$C_6$ alkyl; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (VIII):

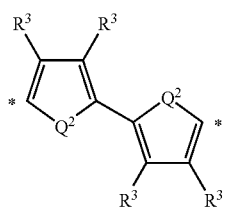
(VIII)

wherein each occurrence of $Q^2$ is independently S, O, or N—$R^4$ wherein $R^4$ is hydrogen or $C_1$-$C_6$ alkyl; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl -O-aryl;

a heteroaryl having the general structure (IX):

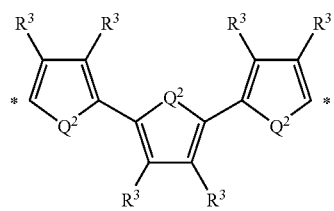
(IX)

wherein each occurrence of $Q^2$ is independently S, O, or N—$R^4$ wherein $R^4$ is hydrogen or $C_1$-$C_6$ alkyl; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl -O-aryl;

a heteroaryl having the general structure (X):

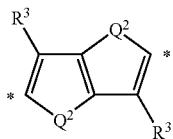
(X)

wherein each occurrence of $Q^2$ is independently S, O, or N—$R^4$ wherein $R^4$ is hydrogen or $C_1$-$C_6$ alkyl; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl -O-aryl;

a heteroaryl having the general structure (XI):

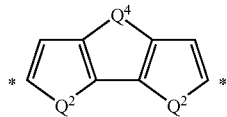

(XI)

wherein each occurrence of $Q^2$ is independently S, O, or N—$R^4$ wherein $R^4$ is hydrogen or $C_1$-$C_6$ alkyl; $Q^4$ is $C(R^3)_2$, S, O, or N—$R^4$; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (XII):

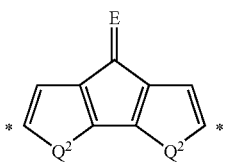

(XII)

wherein each occurrence of $Q^2$ is independently S, O, or N—$R^4$ wherein $R^4$ is hydrogen or $C_1$-$C_6$ alkyl; and E is O or $C(R^7)_2$, wherein each occurrence of $R^7$ is an electron withdrawing group;

a heteroaryl having the general structure (XIII):

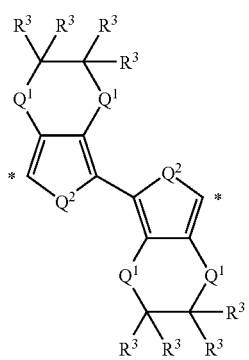

(XIII)

wherein each occurrence of $Q^1$ is independently S or O; each occurrence of $Q^2$ is independently S, O, or N—$R^4$ wherein $R^4$ is hydrogen or $C_1$-$C_6$ alkyl; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (XIV):

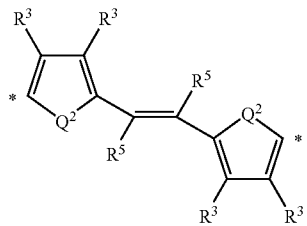

(XIV)

wherein each occurrence of $Q^2$ is independently S, O, or N—$R^4$ wherein $R^4$ is hydrogen or $C_1$-$C_6$ alkyl; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and each occurrence of $R^5$ is hydrogen, $C_1$-$C_6$ alkyl, or cyano;

a heteroaryl having the general structure (XV):

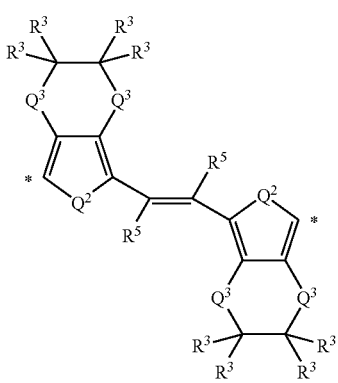

(XV)

wherein each occurrence of $Q^3$ is independently $CH_2$, S, or O; each occurrence of $Q^2$ is independently S, O, or N—$R^4$ wherein $R^4$ is hydrogen or $C_1$-$C_6$ alkyl; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and each occurrence of $R^5$ is hydrogen, $C_1$-$C_6$ alkyl, or cyano;

a heteroaryl having the general structure (XVI):

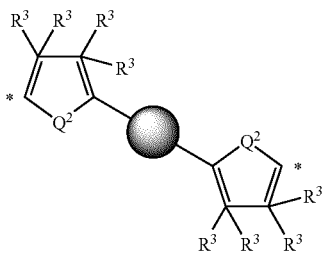

(XVI)

wherein each occurrence of $Q^2$ is independently S, O, or N—$R^4$ wherein $R^4$ is hydrogen or $C_1$-$C_6$ alkyl; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and

represents an aryl;

a heteroaryl having the general structure (XVII):

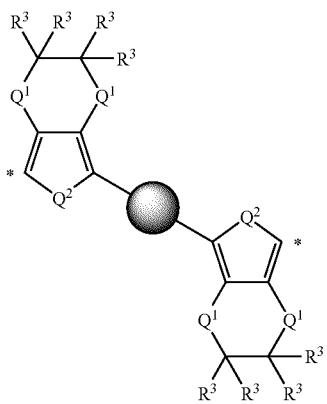

(XVII)

wherein each occurrence of $Q^1$ is independently S or O; each occurrence of $Q^2$ is independently S, O, or N—$R^4$ wherein $R^4$ is hydrogen or $C_1$-$C_6$ alkyl; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and

represents an aryl;

a heteroaryl having the general structure (XVIII):

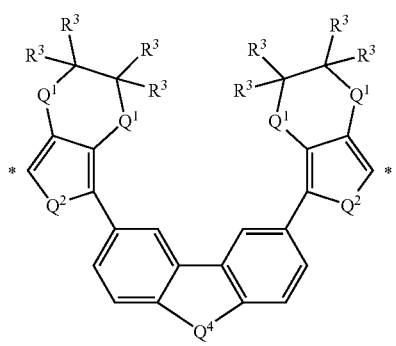

(XVIII)

wherein each occurrence of $Q^1$ is independently S or O; each occurrence of $Q^2$ is independently S, O, or N—$R^4$ wherein $R^4$ is hydrogen or $C_1$-$C_6$ alkyl; $Q^4$ is $C(R^3)_2$, S, O, or N—$R^4$; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (XIX):

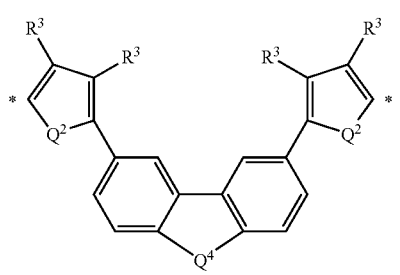

(XIX)

wherein each occurrence of $Q^2$ is independently S, O, or N—$R^4$ wherein $R^4$ is hydrogen or $C_1$-$C_6$ alkyl; $Q^4$ is $C(R^3)_2$, S, O, or N—$R^4$; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (XX):

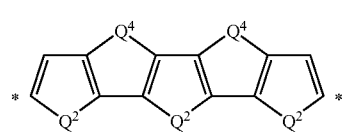

(XX)

wherein each occurrence of $Q^2$ is independently S, O, or N—$R^4$ wherein $R^4$ is hydrogen or $C_1$-$C_6$ alkyl; each occurrence of $Q^4$ is $C(R^3)_2$, S, O, or N—$R^4$; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (XXI):

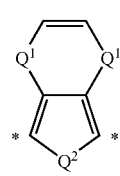

(XXI)

wherein $Q^2$ is S, O, or N—$R^4$ wherein $R^4$ is hydrogen or $C_1$-$C_6$ alkyl; and each occurrence of $Q^1$ is independently S or O;

a heteroaryl having the general structure (XXII):

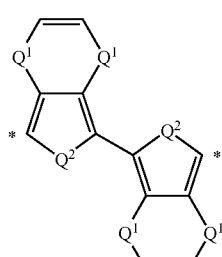

(XXII)

wherein each occurrence of $Q^2$ is independently S, O, or N—$R^4$ wherein $R^4$ is hydrogen or $C_1$-$C_6$ alkyl; and each occurrence of $Q^1$ is independently S or O;

a heteroaryl having the general structure (XXIII):

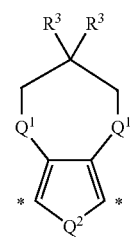

(XXIII)

wherein $Q^2$ is S, O, or N—$R^4$ wherein $R^4$ is hydrogen or $C_1$-$C_6$ alkyl; each occurrence of $Q^1$ is independently S or O; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (XXIV):

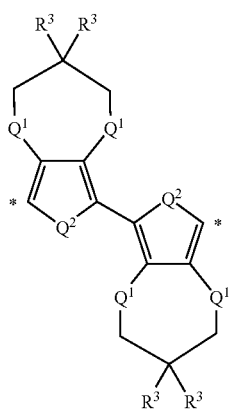

(XXIV)

wherein each occurrence of $Q^2$ is independently S, O, or N—$R^4$ wherein $R^4$ is hydrogen or $C_1$-$C_6$ alkyl; each occurrence of $Q^1$ is independently S or O; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (XXV):

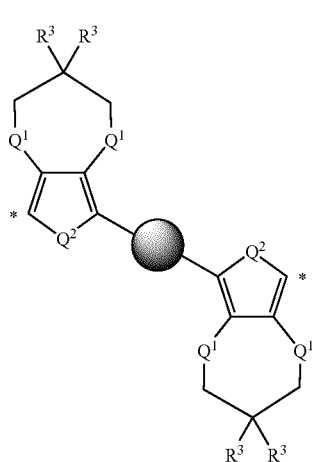

(XXV)

wherein each occurrence of $Q^2$ is independently S, O, or N—$R^4$ wherein $R^4$ is hydrogen or $C_1$-$C_6$ alkyl; each occurrence of $Q^1$ is independently S or O; each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; and

represents an aryl;

a heteroaryl having the general structure (XXVI):

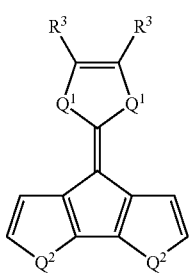

(XXVI)

wherein each occurrence of $Q^2$ is independently S, O, or N—$R^4$ wherein $R^4$ is hydrogen or $C_1$-$C_6$ alkyl; each occurrence of $Q^1$ is independently S or O; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (XXVII):

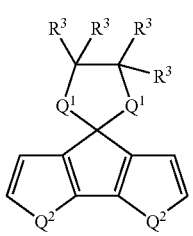

wherein each occurrence of $Q^2$ is independently S, O, or N—$R^4$ wherein $R^4$ is hydrogen or $C_1$-$C_6$ alkyl; each occurrence of $Q^1$ is independently S or O; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl; or combinations comprising at least one of the foregoing heteroaryls.

3. The polymer of claim 2, wherein Ar is a heteroaryl having the general structure (I), (II), and (III):

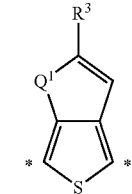
(I)

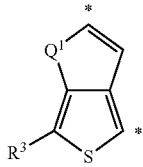
(II)

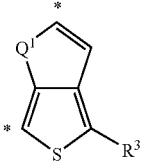
(III)

wherein $Q^1$ is S or O; and $R^3$ is hydrogen, $C_1$-$C_{12}$ alkyl, or $C_1$-$C_{12}$ haloalkyl;

a heteroaryl having the general structure (IV):

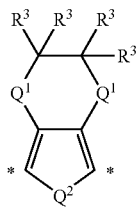
(IV)

wherein each occurrence of $Q^1$ is independently O; $Q^2$ is S; and each occurrence of $R^3$ is hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl;

a heteroaryl having the general structure (VII):

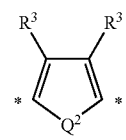
(VII)

wherein $Q^2$ is S; and each occurrence of $R^3$ is independently $C_1$-$C_{12}$ alkyl, $C_1$-$C_{12}$ haloalkyl, or aryl;

a heteroaryl having the general structure (VIII):

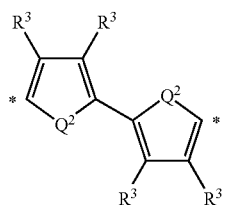
(VIII)

wherein each occurrence of $Q^2$ is independently S; and each occurrence of $R^3$ is Independently $C_1$-$C_{12}$ alkyl, $C_1$-$C_{12}$ haloalkyl, or aryl;

a heteroaryl having the general structure (IX):

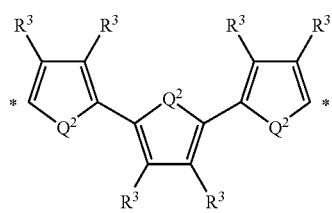
(IX)

wherein each occurrence of $Q^2$ is independently S; and each occurrence of $R^3$ is independently hydrogen, $C_1$-$C_{12}$ alkyl, $C_1$-$C_{12}$ haloalkyl, or aryl;

a heteroaryl having the general structure (XI):

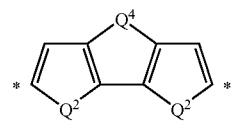
(XI)

wherein each occurrence of $Q^2$ is independently S, O, or N—$R^4$ wherein $R^4$ is hydrogen or $C_1$-$C_6$ alkyl; $Q^4$ is $C(R^3)_2$; and each occurrence of $R^3$ is independently hydrogen, $C_1$-$C_{12}$ alkyl, $C_1$-$C_{12}$ haloalkyl, $C_1$-$C_{12}$ alkoxy, $C_1$-$C_{12}$ haloalkoxy, aryl, —$C_1$-$C_6$ alkyl-O—$C_1$-$C_6$ alkyl, or —$C_1$-$C_6$ alkyl-O-aryl;

a heteroaryl having the general structure (XIII):

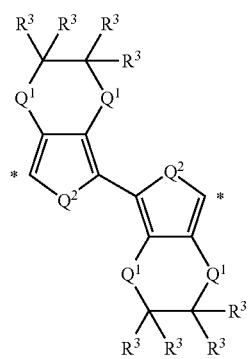
(XIII)

wherein each occurrence of $Q^1$ is independently O; $Q^2$ is S; and each occurrence of $R^3$ is hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl;

a heteroaryl having the general structure (XIV):

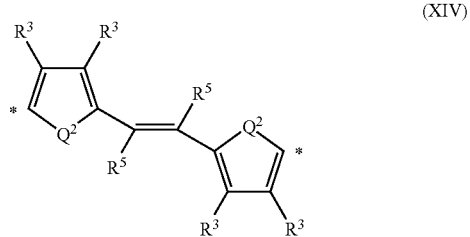

(XIV)

wherein each occurrence of $Q^2$ is independently S; each occurrence of $R^3$ is independently hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl; and each occurrence of $R^5$ is hydrogen, $C_1$-$C_6$ alkyl, or cyano;

a heteroaryl having the general structure (XV):

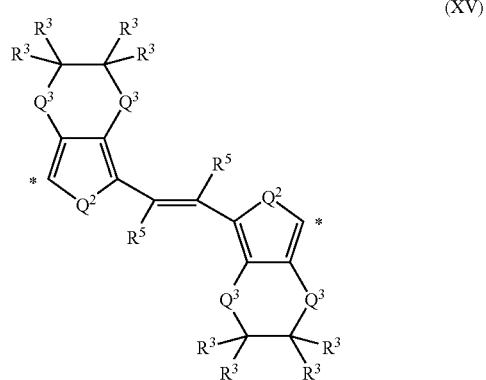

(XV)

wherein each occurrence of $Q^3$ is independently $CH_2$, S, or O; each occurrence of $Q^2$ is independently S; each occurrence of $R^3$ is independently hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl; and each occurrence of $R^5$ is hydrogen, $C_1$-$C_6$ alkyl, or cyano;

a heteroaryl having the general structure (XVI):

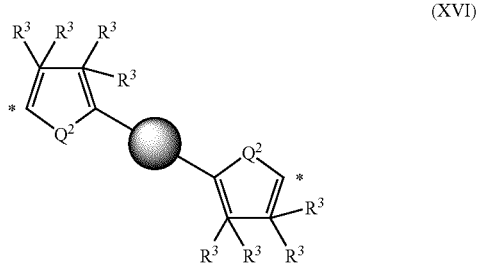

(XVI)

wherein each occurrence of $Q^2$ is independently S; each occurrence of $R^3$ is independently hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl; and

represents furan, pyrrole, N-substituted pyrrole, phenyl, biphenyl, thiophene, fluorene, or 9-alkyl-9H-carbazole;

a heteroaryl having the general structure (XVII):

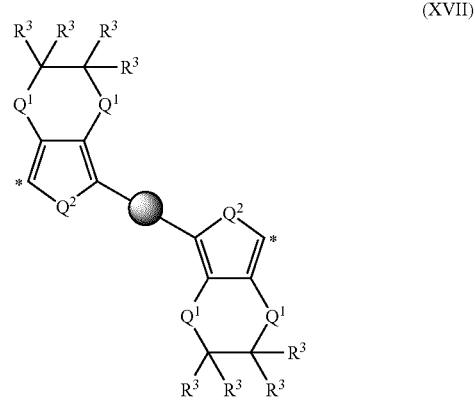

(XVII)

wherein each occurrence of $Q^1$ is independently O; each occurrence of $Q^2$ is independently S; each occurrence of $R^3$ is independently hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl; and

represents furan, pyrrole, N-substituted pyrrole, phenyl, biphenyl, thiophene, fluorene, or 9-alkyl-9H-carbazole;

a heteroaryl having the general structure (XVIII):

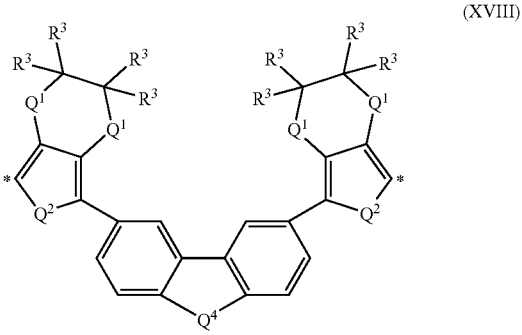

(XVIII)

wherein each occurrence of $Q^1$ is independently O; each occurrence of $Q^2$ is independently S; $Q^4$ is $C(R^3)_2$ or N—$R^4$; and each occurrence of $R^3$ is independently hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl;

a heteroaryl having the general structure (XIX):

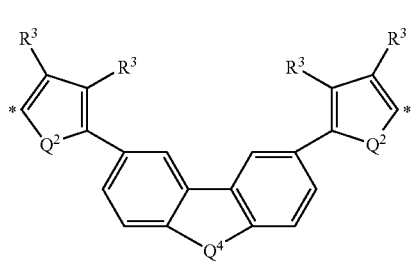
(XIX)

wherein each occurrence of $Q^2$ is independently S; $Q^4$ is $C(R^3)_2$ or N—$R^4$; and each occurrence of $R^3$ is independently hydrogen, $C_1$-$C_{12}$ alkyl, $C_1$-$C_6$ haloalkyl, aryl, —$C_1$-$C_6$ alkyl-O-phenyl, or —$C_1$-$C_6$ alkyl-O-biphenyl;

a heteroaryl having the general structure (XX):

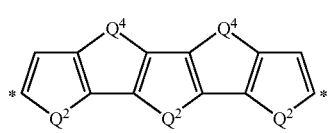
(XX)

wherein each occurrence of $Q^2$ is independently S; each occurrence of $Q^4$ is $C(R^3)_2$ or N—$R^4$; and each occurrence of $R^3$ is independently hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl;

a heteroaryl having the general structure (XXI):

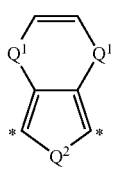
(XXI)

wherein $Q^2$ is S; and each occurrence of $Q^1$ is O;

a heteroaryl having the general structure (XXII):

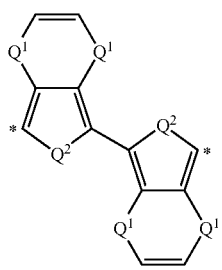
(XXII)

wherein each occurrence of $Q^2$ is independently S; and each occurrence of $Q^1$ is O;

a heteroaryl having the general structure (XXIII):

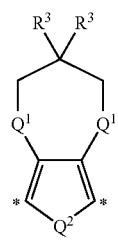
(XXIII)

wherein $Q^2$ is S; each occurrence of $Q^1$ is O; and each occurrence of $R^3$ is independently hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl;

a heteroaryl having the general structure (XXIV):

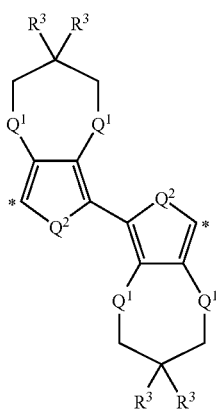
(XXIV)

wherein each occurrence of $Q^2$ is independently S; each occurrence of $Q^1$ is O; and each occurrence of $R^3$ is independently hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl;

a heteroaryl having the general structure (XXV):

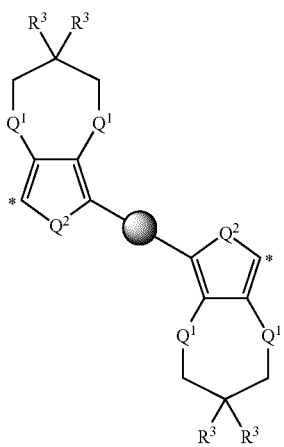
(XXV)

wherein each occurrence of $Q^2$ is independently S; each occurrence of $Q^1$ is O; each occurrence of $R^3$ is independently hydrogen, $C_1$-$C_{12}$ alkyl, $C_1$-$C_{12}$ haloalkyl, aryl, —$C_1$-$C_6$ alkyl-O-phenyl, or —$C_1$-$C_6$ alkyl-O-biphenyl; and represents furan, pyrrole, N-substituted pyrrole, phenyl, biphenyl, thiophene, fluorene, or 9-alkyl-9H-carbazole; or
combinations comprising at least one of the foregoing heteroaryls.

4. The polymer of claim 2, wherein Ar is
a heteroaryl having the general structure (I), (II), and (III):

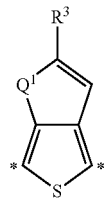
(I)

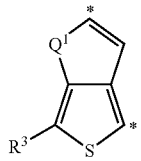
(II)

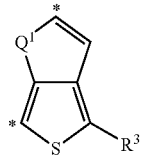
(III)

wherein $Q^1$ is S or O; and $R^3$ is hydrogen, $C_1$-$C_6$ alkyl, or $C_1$-$C_6$ haloalkyl;
a heteroaryl having the general structure (IV):

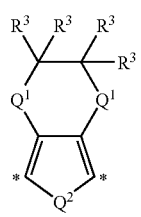
(IV)

wherein each occurrence of $Q^1$ is independently O; $Q^2$ is S; and each occurrence of $R^3$ is hydrogen, $C_1$-$C_6$ alkyl, $C_1$-$C_6$ haloalkyl, —$C_1$-$C_2$ alkyl-O-phenyl, or —$C_1$-$C_2$ alkyl-O-biphenyl;

a heteroaryl having the general structure (VII):

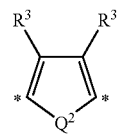
(VII)

wherein $Q^2$ is S; and each occurrence of $R^3$ is independently $C_1$-$C_6$ alkyl, $C_1$-$C_6$ haloalkyl, or aryl;
a heteroaryl having the general structure (VIII):

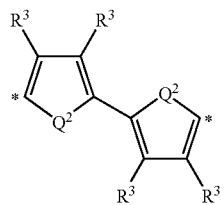
(VIII)

wherein each occurrence of $Q^2$ is independently S; and each occurrence of $R^3$ is independently $C_1$-$C_6$ alkyl, $C_1$-$C_6$ haloalkyl, or aryl;
a heteroaryl having the general structure (IX):

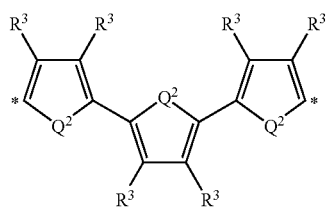
(IX)

wherein each occurrence of $Q^2$ is independently S; and each occurrence of $R^3$ is independently hydrogen, $C_1$-$C_6$ alkyl, $C_1$-$C_6$ haloalkyl, or aryl;
a heteroaryl having the general structure (XI):

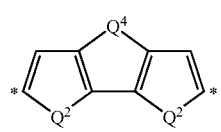
(XI)

wherein each occurrence of $Q^2$ is independently S; $Q^4$ is $C(R^3)_2$; and each occurrence of $R^3$ is independently hydrogen, $C_1$-$C_6$ alkyl, $C_1$-$C_6$ haloalkyl, —$C_1$-$C_2$ alkyl-O-phenyl, or —$C_1$-$C_2$ alkyl-O-biphenyl;

a heteroaryl having the general structure (XIII):

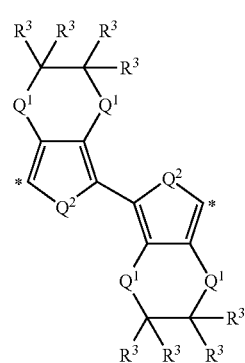

wherein each occurrence of $Q^1$ is independently O; $Q^2$ is S; and each occurrence of $R^3$ is hydrogen, $C_1$-$C_6$ alkyl, $C_1$-$C_6$ haloalkyl, —$C_1$-$C_2$ alkyl-O-phenyl, or —$C_1$-$C_2$ alkyl-O-biphenyl;

a heteroaryl having the general structure (XIV):

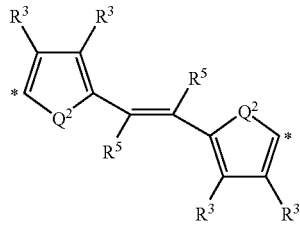

wherein each occurrence of $Q^2$ is independently S; each occurrence of $R^3$ is independently hydrogen, $C_1$-$C_6$ alkyl, $C_1$-$C_6$ haloalkyl, —$C_1$-$C_2$ alkyl-O-phenyl, or —$C_1$-$C_2$ alkyl-O-biphenyl; and each occurrence of $R^5$ is hydrogen, $C_1$-$C_6$ alkyl, or cyano;

a heteroaryl having the general structure (XV):

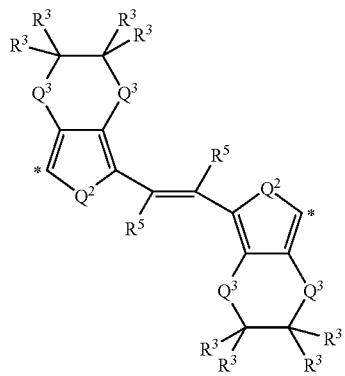

wherein each occurrence of $Q^3$ is independently $CH_2$ or O; each occurrence of $Q^2$ is independently S; each occurrence of $R^3$ is independently hydrogen, $C_1$-$C_{12}$ alkyl, $C_1$-$C_{12}$ haloalkyl, —$C_1$-$C_2$ alkyl-O-phenyl, or —$C_1$-$C_2$ alkyl-O-biphenyl; and each occurrence of $R^5$ is hydrogen, $C_1$-$C_6$ alkyl, or cyano;

a heteroaryl having the general structure (XVI):

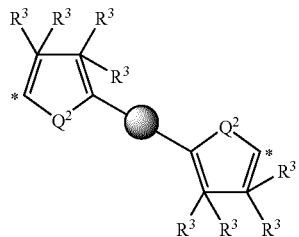

wherein each occurrence of $Q^2$ is independently S; each occurrence of $R^3$ is independently hydrogen, $C_1$-$C_6$ alkyl, $C_1$-$C_6$ haloalkyl, —$C_1$-$C_2$ alkyl-O-phenyl, or —$C_1$-$C_2$ alkyl-O-biphenyl; and

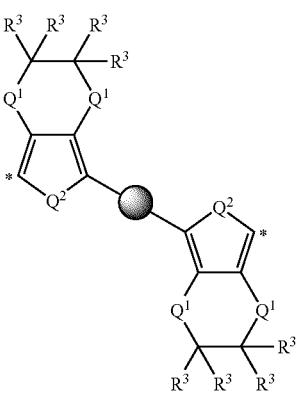

represents furan, pyrrole, N-substituted pyrrole, phenyl, biphenyl, thiophene, fluorene, or 9-alkyl-9H-carbazole;

a heteroaryl having the general structure (XVII):

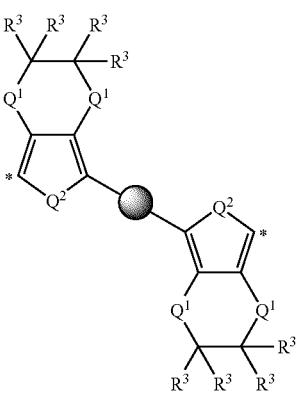

wherein each occurrence of $Q^1$ is independently O; each occurrence of $Q^2$ is independently S; each occurrence of $R^3$ is independently hydrogen, $C_1$-$C_6$ alkyl, $C_1$-$C_6$ haloalkyl, aryl, —$C_1$-$C_2$ alkyl-O-phenyl, or —$C_1$-$C_2$ alkyl-O-biphenyl; and represents furan, pyrrole, N-substituted pyrrole, phenyl, biphenyl, thiophene, fluorene, or 9-alkyl-9H-carbazole;

a heteroaryl having the general structure (XVIII):

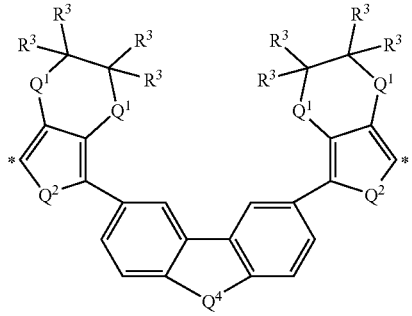

(XVIII)

wherein each occurrence of $Q^1$ is independently O; each occurrence of $Q^2$ is independently S; $Q^4$ is $C(R^3)_2$ or N-Me; and each occurrence of $R^3$ is independently hydrogen, $C_1$-$C_6$ alkyl, $C_1$-$C_6$ haloalkyl, —$C_1$-$C_2$ alkyl-O-phenyl, or —$C_1$-$C_2$ alkyl-O-biphenyl;

a heteroaryl having the general structure (XIX):

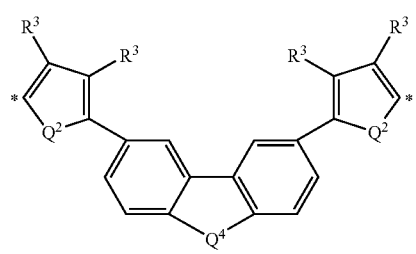

(XIX)

wherein each occurrence of $Q^2$ is independently S; $Q^4$ is $C(R^3)_2$ or NMe; and each occurrence of $R^3$ is independently hydrogen, $C_1$-$C_6$ alkyl, $C_1$-$C_6$ haloalkyl, —$C_1$-$C_2$ alkyl-O-phenyl, or —$C_1$-$C_2$ alkyl-O-biphenyl;

a heteroaryl having the general structure (XX):

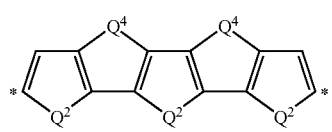

(XX)

wherein each occurrence of $Q^2$ is independently S; each occurrence of $Q^4$ is $C(R^3)_2$ or NMe; and each occurrence of $R^3$ is independently hydrogen, $C_1$-$C_6$ alkyl, $C_1$-$C_6$ haloalkyl, —$C_1$-$C_2$ alkyl-O-phenyl, or —$C_1$-$C_2$ alkyl-O-biphenyl;

a heteroaryl having the general structure (XXIII):

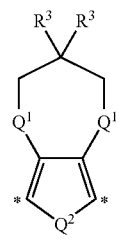

(XXIII)

wherein $Q^2$ is S; each occurrence of $Q^1$ is O; and each occurrence of $R^3$ is independently hydrogen, $C_1$-$C_6$ alkyl, $C_1$-$C_6$ haloalkyl, —$C_1$-$C_2$ alkyl-O-phenyl, or —$C_1$-$C_2$ alkyl-O-biphenyl;

a heteroaryl having the general structure (XXIV):

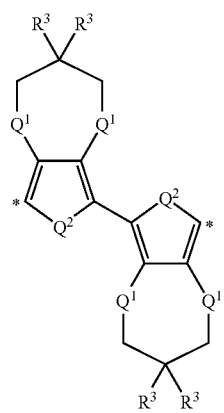

(XXIV)

wherein each occurrence of $Q^2$ is independently S; each occurrence of $Q^1$ is O; and each occurrence of $R^3$ is independently hydrogen, $C_1$-$C_6$ alkyl, $C_1$-$C_6$ haloalkyl, aryl, —$C_1$-$C_2$ alkyl-O-phenyl, or —$C_1$-$C_2$ alkyl-O-biphenyl;

a heteroaryl having the general structure (XXV):

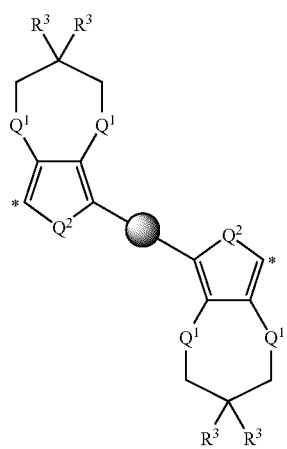

(XXV)

wherein each occurrence of $Q^2$ is independently S; each occurrence of $Q_1$ is O; each occurrence of $R^3$ is independently hydrogen, $C_1$-$C_6$ alkyl, $C_1$-$C_6$ haloalkyl, —$C_1$-$C_2$ alkyl-O-phenyl, or —$C_1$-$C_2$ alkyl-O-biphenyl; and

represents furan, pyrrole, N-substituted pyrrole, phenyl, biphenyl, thiophene, fluorene, or 9-alkyl-9H-carbazole; or
combinations comprising at least one of the foregoing heteroaryls.

5. The polymer of claim 1, wherein $R^1$ and $R^2$ are independently methyl, ethyl, n-propyl, isopropyl, n-butyl, t-butyl, n-pentyl, 3-methylbutyl, sec-pentyl, cyclopentyl, cyclohexyl, n-hexyl, n-heptyl, n-septyl, n-octyl, or the perfluorinated groups thereof.

6. The polymer of claim 1, wherein $R^1$ and $R^2$ are independently methyl or n-octyl.

7. The polymer of claim 1, wherein each occurrence of Y is Si or Ge.

8. The polymer of claim 1, wherein the polymer is a copolymer containing units of Y as Si and units of Y as Ge.

9. The polymer of claim 1, wherein the polymer is semi-crystalline.

10. The polymer of claim 1, wherein the polymer is in liquid crystalline state.

* * * * *